(12) United States Patent
Yan et al.

(10) Patent No.: US 7,311,972 B2
(45) Date of Patent: Dec. 25, 2007

(54) FILLED EPOXY RESIN COMPOSITIONS

(75) Inventors: Yongan Yan, Thousand Oaks, CA (US); Douglas Meyers, Calabasas, CA (US); Mark Morris, Calabasas, CA (US); D. Laurence Meixner, Camarillo, CA (US); Satyabrata Raychaudhuri, Thousand Oaks, CA (US)

(73) Assignee: Yazaki Corporation, Tokyo (JP)

( * ) Notice: Subject to any disclaimer, the term of this patent is extended or adjusted under 35 U.S.C. 154(b) by 436 days.

(21) Appl. No.: 10/967,115

(22) Filed: Oct. 14, 2004

(65) Prior Publication Data

US 2006/0084727 A1    Apr. 20, 2006

(51) Int. Cl.
  B32B 27/38  (2006.01)
  B32B 27/04  (2006.01)
  B32B 27/20  (2006.01)
  H01L 21/56  (2006.01)
  C08L 63/00  (2006.01)

(52) U.S. Cl. .................. 428/413; 438/127; 523/427; 523/440; 523/443; 523/444; 523/445; 523/466; 525/525

(58) Field of Classification Search ............... 428/413; 438/127; 523/427, 440, 443, 444, 445, 457, 523/466; 525/523, 524, 525, 526, 529, 530, 525/532, 533
See application file for complete search history.

(56) References Cited

U.S. PATENT DOCUMENTS

| | | | |
|---|---|---|---|
| 3,547,871 A | 12/1970 | Hofmann | |
| 4,358,552 A | 11/1982 | Shinohara et al. | |
| 5,175,199 A | 12/1992 | Asano et al. | |
| 5,198,479 A | 3/1993 | Shiobara et al. | |
| 5,250,595 A * | 10/1993 | Miyashita et al. | 524/114 |
| 5,618,872 A | 4/1997 | Pohl et al. | |
| 6,246,123 B1 | 6/2001 | Landers, Jr. et al. | |
| 6,841,888 B2 * | 1/2005 | Yan et al. | 257/794 |
| 2005/0101699 A1 * | 5/2005 | Yan et al. | 523/443 |

FOREIGN PATENT DOCUMENTS

| | | | |
|---|---|---|---|
| EP | 0 391 447 B1 | | 11/1994 |
| JP | 60-184561 A | | 9/1985 |
| JP | 4222855 | | 8/1992 |
| JP | 06-065473 | * | 3/1994 |
| JP | 11-074424 | | 3/1999 |
| JP | 2001-261933 | | 9/2001 |
| JP | 2002-080698 | * | 3/2002 |
| JP | 2002-105291 | | 4/2002 |
| JP | 2003-003043 | | 1/2003 |

OTHER PUBLICATIONS

Machine translation of JP 2002-080698, provided by the JPO website.*
Machine translation of JP 06-065473, provided by the JPO website.*

* cited by examiner

Primary Examiner—Michael J. Feely
(74) Attorney, Agent, or Firm—Sheppard, Mullin, Richter & Hampton LLP

(57) ABSTRACT

An encapsulant is described for an optoelectronic device or optical component, which provides a coefficient of thermal expansion of less than 50 ppm/° C., with a variation of less than ±30%, and further provides an optical transmittance of at least 20% at a wavelength in the range of 400 to 900 nm, at an encapsulant thickness of about 1 mm. The encapsulant includes a filler consisting essentially of glass particles having diameters smaller than 500 μm, being essentially free of titania and lead oxide, and having a refractive index in the range of 1.48 to 1.60, with a variance of less than about 0.001. A method for making the encapsulant also is described, the method including steps of (1) processing the glass to form particles having diameters between 1 and 500 μm, (2) preparing an epoxy resin composition having at a cured stage a refractive index close to that of the glass filler particles, (3) mixing the epoxy resin composition with the filler particles to form a filled epoxy resin composition, (4) encapsulating an optoelectronic device with the filled epoxy resin composition, and (5) curing the filled epoxy resin composition.

36 Claims, 9 Drawing Sheets

FILLED EPOXY RESIN COMPOSITIONS

BACKGROUND OF THE INVENTION

The present invention relates generally to encapsulants for optoelectronic devices and, more particularly, to such encapsulants exhibiting superior optical, thermo-mechanical, electrical, and environmental qualities. The present invention also relates to methods for making such encapsulants.

Optical and electronic (i.e., "optoelectronic") devices, such as LEDs, photodetectors, and fiber optic components, generally are encapsulated using a variety of materials to protect the devices from vibration, humidity, heat, environmental deterioration, electrical leakages, and other deteriorative factors.

U.S. Pat. No. 3,547,871 to Hofman et al. describes a low coefficient of thermal expansion ("CTE") encapsulant comprising an epoxy resin and a filler having a particle size ranging between 10 μm and 300 μm. This encapsulant resin has a viscosity below 20,000 cP, at 100° C. The filler is selected from silica, fused quartz, beryllium aluminum silicate, lithium aluminum silicate, and mixtures of these. The encapsulants have a CTE lower than 50 ppm/° C. The Hofman '871 patent does not disclose the encapsulant's light transmittance.

U.S. Pat. No. 5,175,199 to Asano et al. describes a sol-gel method for making a multi-component glass filler to be mixed into a transparent epoxy, which can be used as an encapsulant for optical semiconductor devices. In this method, a $TiO_2$—$SiO_2$ gel is synthesized by hydrolyzing and condensing a silicon alkoxide and a titanium alkoxide. This gel is dried, and then either ground into particulate matter, followed by sintering to dense glass beads, or sintered into a dense glass followed by grinding into glass beads. This sintering is achieved at a very high temperature range of 1,050° C. to 1,250° C. The disclosed filler manufacturing method has the disadvantages of being complicated and expensive, as well as requiring lengthy preparation time and high sintering temperature. Additional disadvantages include possible phase separation, crystallization, and coloring of $TiO_2$ at the high sintering temperatures required using the method. Phase separation and crystallization cause intolerably high refractive index differences between the glass filler and the epoxy, thereby lowering the transmittance. $TiO_2$ also is known to possibly cause yellowing of organic resins in which it is included as a result of extended exposure to light. This leads to degradation of the transmittance of the encapsulant over time.

U.S. Pat. No. 5,198,479 to Shiobara et al. uses the method described in the Asano et al. '199 patent described above, and it further discloses a method to overcome the discoloration problems of the $TiO_2$—$SiO_2$ fillers discussed above, by the addition of organic phosphorus anti-discoloring agents into the uncured epoxy-filler composition. This addition, while effective, further complicates use of the method, and the resulting filler therefore is even more expensive to manufacture.

European Patent No. 0 391 447 B1 to Nakahara et al. teaches a sol-gel method for the production of multi-component metal-oxide particles that can be used as fillers in transparent organic resins. The Nakahara et al. method incorporates steps of first preparing seed particles of single-component metal oxides and then growing these particles by adding hydrolyzable and condensable organic metal compounds such as metal alkoxides, to prepare multi-component particles such as $TiO_2$—$SiO_2$, $ZrO_2$—$SiO_2$, and $Al_2O_3$—$SiO_2$. This process is considered unduly complicated and expensive.

U.S. Pat. No. 5,618,872 to Pohl et al. describes a method for making multi-component encapsulant filler particles for optoelectronic devices, comprising two or more oxides selected from $SiO_2$, $TiO_2$, $ZrO_2$, $Al_2O_3$, $V_2O_5$, and $Nb_2O_5$. The method for particle preparation described in this patent is similar to that described in the Nakahara et al. patent, and it shares the same drawbacks.

Dunlap and Howe, in *Polymer Composites*, vol. 12(1), pp. 39-47, (1991), describe a casting composition comprising a resin and an index-matched filler prepared by ball-milling of a glass. The size of the filler particles ranges between 2 μm and 100 μm. Subsequent to ball-milling, the filler particles are annealed at temperatures between 0° C. and 10° C. above the glass strain point for at least one hour, to remove stresses as well as organic contaminants. The inventors have found that heat treatments at temperatures above the strain point of the glass can reduce transmittance, and therefore such temperatures should be avoided.

Japanese Patent Publication No. 11-074424 to Yutaka et al. describes a method for making an encapsulant for use in a photosemiconductor device. In this method, a silica powder containing PbO or $TiO_2$ having a particle size ranging between 3 μm and 60 μm is used as an index-matched filler for an epoxy resin composition. PbO or $TiO_2$ can cause crystallization during manufacturing of these multi-component glass fillers, thereby decreasing the transmittance of the filled epoxy. In addition to the aforementioned disadvantages of using $TiO_2$ as a filler material, PbO is known to be a health hazard, and its use in manufacturing of the encapsulants should therefore be avoided.

U.S. Pat. No. 6,246,123 to Landers et al. describes an encapsulant having high transmittance, low CTE, and low Tg. The encapsulant is made from a polymer resin and an index-matched filler. However, the filler is selected from a group consisting of alkali zinc borosilicate glasses. The presence of alkali ions is known to potentially reduce electrical resistivity of encapsulants, leading to high leakage currents and possible damage to the encapsulated device. For example, U.S. Pat. No. 4,358,552 to Shinohara et al. explains that encapsulants incorporating low levels of alkali contaminants, such as $Li^+$, $Na^+$, $K^+$, and ionic contaminants such as Cl, improves electrical insulation of the encapsulated electronic device.

Naganuma et al. in *Journal of Material Science Letters*, vol. 18, pp. 1587-1589, (1999), describes preparation of encapsulants for optoelectronic devices by mixing an epoxy with a filler prepared from a multicomponent glass, $SiO_2$—$Al_2O_3$—$B_2O_3$—MgO—CaO having an average particle size of 26 μm or 85 μm. During the described curing of the epoxy and the filler mixture, the mold is turned over every 10 minutes to prevent segregation of the filler.

Japanese Patent Publication No. 2001-261933 to Yamada et al. describes an epoxy resin composition for making an encapsulant for use in a photosemiconductor device, comprising an epoxy resin, a hardener, an accelerator, and a glass filler. The refractive index of the glass filler is adjusted to match that of the epoxy resin by using multi-component glasses that are prepared by blending oxides such as $Na_2O$, $Al_2O_3$, CaO, BaO, ZnO, $TiO_2$, and $B_2O_3$.

Japanese Patent Publication No. 2002-105291 to Komori et al. likewise describes an epoxy resin composition for making an encapsulant for use in a photosemiconductor device, the epoxy resin composition comprising an epoxy resin, a hardener, an accelerator, and a glass filler. The refractive index of the glass powder is adjusted to match that of the epoxy resin by using multi-component glasses that are prepared by blending oxides such as $SiO_2$, $Al_2O_3$, and CaO. Komori et al. specifies that the filler should be in spherical shape and particle size of this filler should be in the range of 5 μm to 100 μm.

It should be appreciated from the foregoing description that there remains a need for an improved transparent encapsulant suitable for manufacturing of optoelectronic devices, which avoids the drawbacks of the encapsulants and manufacturing methods described above. The present invention fulfills this need and provides further advantages.

SUMMARY OF THE INVENTION

The present invention is embodied in an encapsulant for an optoelectronic device or optical component, and in an assembly that includes an optoelectronic device substantially encased in such an encapsulant, which provides a coefficient of thermal expansion (CTE) having an average value of less than 50 ppm/° C., with a variation of less than ±30%, and an optical transmittance of at least 20% when measured at a wavelength in the range of 400 nm to 900 nm at an encapsulant thickness of about 1 mm. The encapsulant includes a glass filler and an epoxy resin composition at a cured stage. The glass filler consisting essentially of glass particles having diameters smaller than 500 μm and formed from a glass essentially free of titania and essentially free of lead oxide. The glass filler has a glass refractive index in the range of 1.48 to 1.60, with a variance of less than about 0.001, and the filler refractive index is sufficiently similar to the glass refractive index to achieve the specified CTE and CTE variation and optical transmittance.

In other, more detailed features of the invention, the encapsulant's CTE has an average value of less than 40 ppm/° C. and a variation of less than ±10%. In addition, encapsulant's optical transmittance is at least 40%, and more preferably at least 60%, when measured at a wavelength in the range of 400 nm to 900 nm at an encapsulant thickness of about 1 mm.

In other, more detailed features of the invention, the glass particles are essentially free of alkali, and they preferably are a mixture of at least two oxides selected from a group consisting of BaO, CaO, MgO, ZnO, SrO, $SiO_2$, $ZrO_2$, $B_2O_3$, $Al_2O_3$, and $Bi_2O_3$. In addition, the glass particles are prepared from a glass selected from the group consisting of borosilicate glasses, aluminosilicate glasses, boro aluminosilicate glasses, calcium silicate glasses, calcium aluminosilicate glasses, magnesium aluminosilicate glasses, and mixtures thereof. Borosilicate glasses are most preferred.

In yet other more detailed features of the invention, the glass particles have diameters in the range of 1 μm to 250 μm, and more preferably in the range of 1 μm to 125 μm. In addition, the volume percentage of the encapsulant constituted by the filler preferably in the range of 5 to 60%, more preferably 10 to 50%, and most preferably 15 to 40%. Further, the volume percentage of the glass particles constituted by particles having diameters smaller than 10 μm preferably is less than 60%, more preferably is less than 40%, and most preferably is less than 10%.

In other features of the invention, the glass particles are heat-treated for at least one hour at a heat-treatment temperature less than or equal to the strain point of the glass. More preferably, the heat treatment temperature is between 20° C. and the strain point of the glass. The heat treatment has a duration between preferably between 5 hours and 50 hours, and more preferably between 30 hours and 40 hours.

In addition, the glass filler particles preferably are reacted with a silane coupling agent selected from the group consisting of aminopropyltriethoxysilane, vinyltrimethoxysilane, methacryloxy propyltriethoxysilane, 3-glycidoxypropyltrimethoxysilane, and mixtures thereof.

Further, the epoxy resin composition at a cured stage preferably is prepared by steps of (1) mixing epoxy resin composition comprising at least one epoxy resin, at least one hardener, and at least one accelerator with the filler, (2) encapsulating the optoelectronic device with this filled epoxy resin composition, and (3) curing the filled epoxy resin composition encapsulating the optoelectronic device. The epoxy resin preferably is selected from the group consisting of bisphenol-A epoxy resins, bisphenol-F epoxy resins, bisphenol-S epoxy resins, hydrogenated bisphenol-A epoxy resins, novolac epoxy resins, cyclo-aliphatic epoxy resins, nitrogen-containing epoxy resins, aliphatic epoxy resins, glycidyl ether epoxy resins, biphenyl epoxy resins, dicyclo epoxy resins, naphthalene epoxy resins, and mixtures thereof. The hardener preferably is selected from the group consisting of acid anhydride hardeners, phenolic hardeners, and mixtures thereof. More particularly, the hardener is selected from the group consisting of phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride, and phenolic novolac resin hardeners, and mixtures thereof. Further, the accelerator preferably is selected from the group consisting of 1,8-diazabicyclo[5,4,0]undecene-7, triethylenediamine, tertiary amines, 2-ethyl-4-methylimidazole, 2-methylimidazole, triphenylphosphite, tetraphenylphosphonium tetraphenylborate, tetra-n-butylphosphonium O,O-diethyl phosphorodithioate, quaternary ammonium salts, organic metal salts, and mixtures thereof.

In one preferred form, the epoxy resin composition includes at least one hardener, at least one accelerator, and a binary epoxy mixture including a bisphenol-A epoxy resin and a cyclo-aliphatic epoxy resin. The ratio by molar amount of bisphenol-A epoxy resin to the combined molar amount of the binary epoxy mixture is in the preferred range of 0.001 to 0.900, and in the more preferred range of 0.10 to 0.25. Further, the ratio by molar amount of the hardener to the combined molar amount of the binary epoxy mixture is in the preferred range of 0.100 to 0.177, and in the more preferred range of 0.500 to 0.900. Finally, the ratio by molar amount of the accelerator to the combined molar amount of the binary epoxy mixture is in the preferred range of 0.0005 to 0.0400, and in the more preferred range of 0.0030 to 0.0250.

In an alternative preferred form, the epoxy resin composition includes at least one hardener, at least one accelerator, and a ternary epoxy mixture including a bisphenol-A epoxy resin, a cyclo-aliphatic epoxy resin, and triglycidyl isocyanurate resin. The ratio by molar amount of bisphenol-A epoxy resin to the combined molar amount of the ternary epoxy mixture is in the preferred range of 0.05 to 0.6, and in the more preferred range of 0.15 to 0.40. In addition, the ratio by molar amount of cyclo-aliphatic epoxy resin to the combined molar amount of the ternary epoxy mixture is in the preferred range of 0.05 to 0.70, and in the more preferred range of 0.10 to 0.55. Further, the ratio by molar amount of triglycidyl isocyanurate resin to the combined molar amount of the ternary epoxy mixture is in the preferred range of 0.05 to 0.70, and in the more preferred range of 0.20 to 0.65. Further, the ratio by molar amount of the hardener to the combined molar amount of the ternary epoxy mixture is in the preferred range of 0.50 to 1.20, and in the more preferred range of 0.70 to 1.00. Finally, the ratio by molar amount of the accelerator to the combined molar amount of the ternary epoxy mixture is in the preferred range of 0.001 to 0.050, and the more preferred range of 0.004 to 0.030.

The invention also resides in a method for making an encapsulant of the kind described above. The method includes steps of (1) processing a glass characterized by a glass refractive index in the range of 1.48 to 1.60, with a variance of less than about 0.001, to form filler particles having diameters between 1 μm and 500 μm and characterized by a filler refractive index, (2) preparing an epoxy resin composition characterized by the refractive index of an epoxy resin composition at a cured stage, wherein the filler refractive index and the refractive index of the epoxy resin composition at a cured stage are sufficiently similar such that the encapsulant has optical transmittance of at least 20% when measured at a wavelength in the range of 400 nm to 900 nm at an encapsulant thickness of about 1 mm, (3) mixing the epoxy resin composition with the filler particles to form a filled epoxy resin composition, (4) encapsulating the optoelectronic device with the filled epoxy resin composition, and (5) curing the filled epoxy resin composition encapsulating the optoelectronic device.

In more detailed features of the method of the invention, the step of processing a glass includes processing the glass to form filler particles having diameters between 1 μm and 250 μm. The volume percentage of such filler particles having diameters less than 10 μm preferably is less than 60 percent, more preferably is less than 20%, and most preferably is less than 10%. Most preferably, all of the glass filler particles have diameters between 10 μm and 250 μm.

In other, more detailed features of the invention, the method further includes a step of heating the filler particles in an oxygen-containing atmosphere after the step of processing a glass to form filler particles. Such heating occurs at a preferred temperature less than or equal to the strain point of the glass, and more preferred temperature between 20° C. and the strain point of the glass. Such heating has a duration preferably of at least about 1 hour, more preferably between 5 and 50 hours, and most preferably between 30 hours and 40 hours. The heating preferably occurs in dry air. In another more detailed feature of the invention, the method further includes a step of reacting the glass particles with a silane coupling agent after the step of processing the glass to form filler particles.

In yet other, more detailed features of the invention, the step of preparing an epoxy resin composition includes mixing together at least one epoxy resin, at least one hardener, and at least one accelerator. The epoxy resin composition is formulated to have a sufficient viscosity such that the settling velocity of the filler particles in the epoxy resin composition is preferably less than about 11 mm/min, more preferably less than about 6 mm/min, and most preferably less than about 4 mm/min.

In another feature of the invention, the method includes a preliminary step of heating the epoxy resin composition to a predetermined temperature for a time duration sufficient to increase the composition's viscosity to a level characterized by a settling velocity equal to or greater than a predetermined value. The heating temperature is in the preferred range of 80° C. to 140° C., and the more preferred range of 90° C. to 110° C., and most preferably about 100° C. The heating has a duration sufficient to increase the viscosity of the epoxy resin composition to be in the preferred range of 300 cP to 40,000 cP, the more preferred range of 500 cP to 20,000 cP, and the most preferred range of 750 cP to 10,000 cP.

In a further feature of the invention, the method further includes a step of cooling the filled epoxy resin composition, after it has been mixed with the filler particles, to a predetermined temperature sufficient to increase the composition's viscosity to a value within a predetermined range. Such cooling is to a temperature sufficient to increase the viscosity of the epoxy resin composition to a value in the preferred range of 1,000 cP to 40,000 cP, the more preferred range of 5,000 cP to 20,000 cP, and the most preferred range of 7,000 cP to 12,000 cP. Further, the method includes a step of removing air bubbles from the filled epoxy resin composition within 30 minutes before encapsulating the optoelectronic device with the filled epoxy resin composition.

Other features and advantages of the present invention should become apparent from the following description of the preferred embodiments and method, taken in conjunction with the accompanying drawings, which illustrate, by way of example, the principles of the invention.

DETAILED DESCRIPTION OF THE PREFERRED EMBODIMENTS

Figure 1:
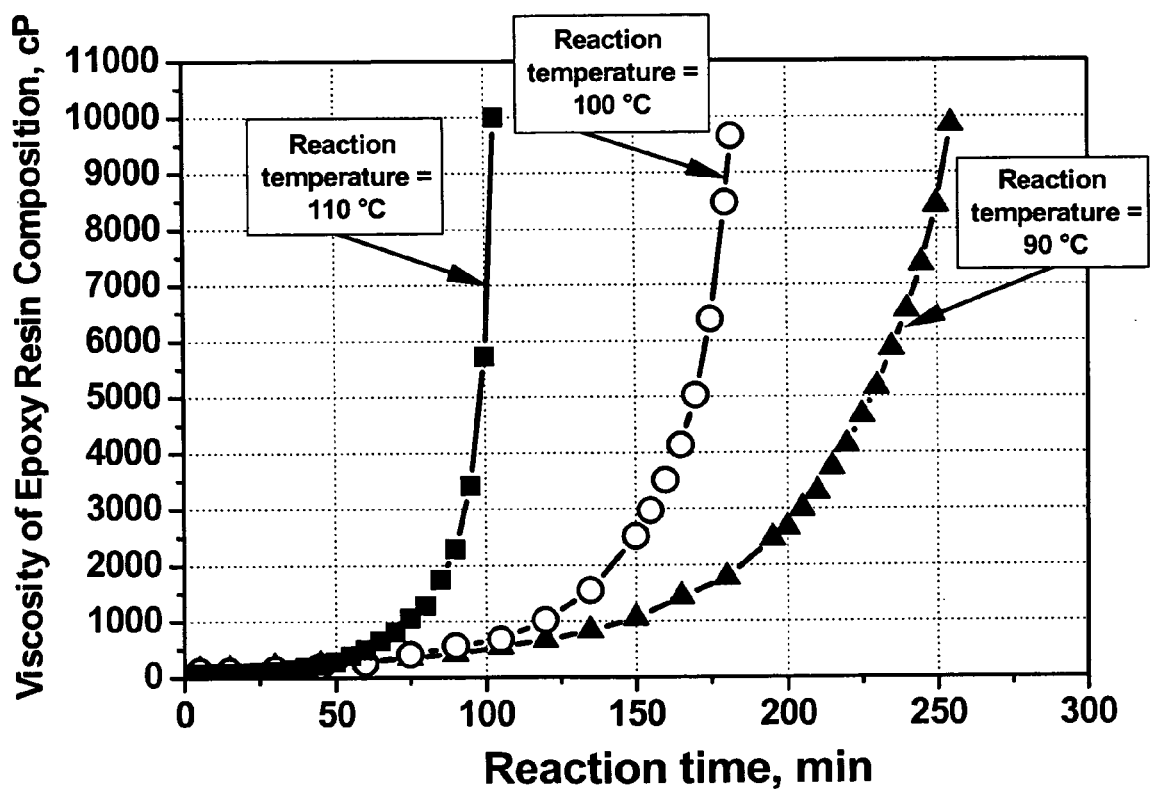
FIG. 1 is a graphical representation of the relationship between reaction time, reaction temperature, and viscosity of three liquid epoxy resin compositions after addition of accelerator. The three epoxy resin compositions are prepared in the same manner as described in EXAMPLE 1, reacted at different combinations of temperatures and time durations.

The present invention is embodied in a transparent encapsulant for use with optoelectronic devices, the encapsulant incorporating a glass filler and an epoxy resin composition at a cured stage, and the invention further is embodied in an optoelectronic device substantially encased in such an encapsulant. The encapsulant is suitable for use with optoelectronic devices such as LEDs, photodetectors, and fiber optic devices, and with optical components such as lenses, prisms, and mirror substrates.

The glass filler is made from commercial glass particles having predetermined particle sizes that are optionally heat-treated under predetermined conditions to improve the filler's optical properties. The epoxy resin composition is prepared from conventional materials in molar ratios selected such that the resulting encapsulant is highly transparent and such that the refractive index of the epoxy resin composition at a cured stage closely matches the refractive index of the filler. The encapsulant of the present invention offers a unique combination of low and uniform coefficient of thermal expansion ("CTE") and high transparency, along with high electrical resistivity and environmental durability. The present invention also resides in a method for making this encapsulant. This transparent encapsulant possesses a number of particular characteristics, described in detail below.

The encapsulant has a CTE preferably lower than 50 ppm/° C. Also, variations in the CTE are lower than±30% over the encapsulant's entire volume. If the CTE and/or its variation are greater than these values, the encapsulant can excessively expand or contract when exposed to varying temperatures, thereby breaking the encapsulated device or its leads.

In addition, the encapsulant also has a preferred light transmittance of at least 20%, at a wavelength in the range of 400 nm to 900 nm and a thickness of about 1 mm. The encapsulant also has a glass transition temperature ("$T_g$") preferably higher than 120° C. Because optoelectronic devices ordinarily are subjected to temperatures substantially higher than usual ambient temperatures, the encapsulant can deform when such temperatures approaches or exceeds its glass transition temperature, which can destroy the encapsulated device.

The encapsulant also has high electrical resistivity, to provide sufficient insulation to protect the optoelectronic devices from the effects of adverse environmental conditions, such as heat and humidity. Finally, the encapsulant is inexpensive and easy to produce, using readily available materials.

Encapsulants having refractive indices (i.e., $n_D$ at 25° C.) varying between 1.48 and 1.60, at a wavelength of about 588 nm, can be prepared by curing commercially available resins incorporating epoxy groups. These inexpensive unfilled encapsulants also are known to exhibit high light transmittance, high $T_g$, high electrical resistivity, and high heat resistance. However, these unfilled encapsulants usually have a CTE higher than 50 ppm/° C., and therefore are unsuitable for use as encapsulants for optoelectronic devices, which typically are subjected to substantially varying temperatures during their operation.

Encapsulants having low CTE can be prepared by mixing commercially available uncured epoxy resin compositions with inorganic fillers, followed by curing of this mixture. Such fillers and such epoxy resin compositions in accordance with the invention have the characteristics described below.

The filler is uniformly dispersed in the epoxy resin composition to provide a uniform CTE over the encapsulant's entire volume. This prevents eventual damage of the optoelectronic device from the cumulative effect of operation at varying temperatures. To obtain uniform particle dispersion and produce an encapsulant having a uniform CTE, the filler has a predetermined and consistent particle size, and the liquid epoxy resin composition has a predetermined viscosity before incorporation of the filler into the liquid epoxy resin composition. If the filler particle size is smaller than about 10 µm, particularly smaller than about 1 µm, the particles tend to agglomerate when mixed with the liquid epoxy resin composition, resulting in non-uniform particle dispersions and lowered light transmittance of the encapsulant. Such agglomeration might be avoided by reducing the amount of the filler used in the encapsulant. However, reducing the amount of filler tends to increase the encapsulant's CTE above 50 ppm/° C.

Therefore, preferably agglomeration is avoided by using fillers having particle sizes greater than about 1 µm. Unfortunately, if filler particle size is larger than about 1 µm, the particles can settle at the bottom of the liquid epoxy resin composition during preparation of the filled epoxy resin composition and/or encapsulation of the optoelectronic device due to gravity. This settling will occur if viscosity of the epoxy resin composition is too low during preparation of the filled epoxy resin composition and/or encapsulation of the device, leading to non-uniform filler distribution and non-uniform CTE in the encapsulant. Conversely, if the viscosity is too high, forming the encapsulant layer over the optoelectronic device can be difficult. Therefore, the viscosity of the liquid epoxy resin composition preferably is within a specified range, in order for the material to be useful in preparation of the encapsulant.

In addition to uniform dispersion, the refractive index of the filler closely matches the refractive index of the epoxy resin composition at the cured stage, to have sufficient light transmittance. Inorganic fillers frequently are used to lower costs or enhance mechanical properties of the resins. However, their use can lead to decreased optical transmittance and scattering of light by the medium produced. This scattering can be decreased, and the optical transmittance of the medium can be increased, by closely matching the refractive index of the transparent filler with that of the transparent epoxy resin composition at the cured stage. Because the refractive index of these filler particles generally cannot be directly measured with sufficient precision, this matching generally must be performed by trial and error, adjusting the refractive index of the filler and/or the epoxy resin composition as needed.

Also, the filler is free of chemical compounds that can reduce the electrical resistivity of the encapsulant below an acceptable level under the temperature and humidity conditions of the device. Some of these compounds have inherently low electrical resistivity, while others can decompose into or form electrically conductive ions. Heat and humidity can affect this inherent electrical resistivity or this decomposition, as well as migration of the ions. Therefore, preparation of the filler from such compounds is avoided. Finally, the filler is manufactured easily and inexpensively.

Single-component particles of inorganic metal oxides, such as $SiO_2$, $TiO_2$, and $ZrO_2$, are known to be easily and inexpensively prepared using vapor deposition or solution precipitation processes. These particles can be used as fillers in encapsulants. However, these particles are often less than 1 µm in size, and therefore generally are unsuitable for use as fillers for the reasons described above. Furthermore, most single-component particles may not be used as fillers, because they have refractive indices incompatible with those of typical epoxy resin compositions. For example, the fixed refractive index of $SiO_2$ particles is 1.46, of $TiO_2$ (rutile form) is 2.3, and of $ZrO_2$ is 1.95.

In this invention, the suitable fillers are prepared by crushing and grinding single- or multi-component bulk glasses having refractive indices in the range between 1.48 and 1.60, as measured at a wavelength of about 588 nm and a temperature of about 25° C. These glasses must have substantially homogeneous refractive indices to be suitable for preparation of the filler particles. Excessive variation in the filler's refractive index would make it impossible to prepare a filler that closely and consistently matches the refractive index of the epoxy resin composition at the cured stage. Preferably, the refractive index variation within the bulk glass is less than 0.001.

Furthermore, this glass is free of $TiO_2$, which can cause yellowing of the epoxy resin composition. The presence of lead oxide in the multi-component glass is avoided because of its toxicity. Also, this glass is substantially free of alkali ions such as $Li^+$, $Na^+$, $K^+$, or other electrically conductive ions, to obtain encapsulants having high electrical resistivity. However, $TiO_2$-free and lead oxide-free glasses containing alkali ions, such as soda lime glasses, can be used for preparation of filler particles for encapsulants for electronic devices that can tolerate low electrical resistivity, or for optical components, such as lenses, for which no requirements for electrical insulation exist.

Preferable glasses are multi-component glasses that comprise two or more oxides selected from the group consisting of BaO, CaO, MgO, ZnO, SrO, $SiO_2$, $ZrO_2$, $B_2O_3$, $Al_2O_3$ and $Bi_2O_3$ such as borosilicate glasses, aluminosilicate glasses, boro aluminosilicate glasses, calcium silicate glasses, calcium aluminosilicate glasses, magnesium aluminosilicate glasses, and mixtures thereof. Borosilicate glasses sold under the trademarks D263 and AF45, by Schott Corporation of Yonkers, N.Y.; aluminosilicate glasses sold under the trademarks NA-35 and NA-40, by Hoya Corporation of Tokyo, Japan; and boro aluminosilicate glasses sold under the trademarks Eagle 2000, Corning 1737, and Corning 7059, by Corning Corporation of Corning, N.Y., are particularly suitable glasses. A commercially available, alkali-free borosilicate glass having a typical composition by weight of 10% to 50% $SiO_2$, 10% to 50% BaO, 10% to 20% $Al_2O_3$, and 10% to 20% $B_2O_3$, is particularly suitable for use as a filler material.

To prepare the filler, a titania-free and lead oxide-free glass first is crushed into coarse, irregular particles approximately 5 mm or less in size. These coarse particles then are ball-milled into finer particles using conventional methods. These finer particles are first screened and then solvent-washed. The particles are finally dried and taken for use as the filler material. These particles have sizes preferably smaller than about 500 µm, more preferably smaller than about 250 µm, and most preferably smaller than about 125 µm. Particles smaller than 10 µm, and particularly smaller than 1 µm, can easily aggregate and/or trap bubbles after they are mixed with the epoxy resin composition. This can lead to poor light transmission caused by scattering and poor CTE distribution caused by inhomogeneous particles size distribution within the encapsulant. Therefore, the amount of particles smaller than about 10 µm in the filler preferably is lower than about 60 volume percent of the filler, more preferably lower than about 20 volume percent, and most preferably lower than about 10 volume percent. The filler particles preferably have no particles smaller than about 1 µm.

The filler particles thereby obtained then are optionally heat-treated, at temperatures preferably lower than the strain point of the glass. For example, fillers comprising borosilicate particles are optionally heat treated below the strain point of the borosilicate glass, i.e., about 627° C., preferably between 20° C. and 627° C., and most preferably between 450° C. and 550° C. The optional heat treatment is carried out for duration of at least 1 hour, more preferably between 5 hours and 50 hours, and most preferably between 30 hours and 40 hours. To provide for improved optical properties in the filler material, this optional heat treatment preferably takes place in an oxygen-containing atmosphere, most preferably in dry air composed of about 21% $O_2$ and about 79% $N_2$, with moisture content less than 60 ppm.

The miscibility and bonding of the filler particles with the epoxy resin composition can be increased by using a suitable silane coupling agent. As is well known in the art, for example, in *Silane Coupling Agents* by Edwin P. Plueddemann (Plenum Press, New York, 1991), these agents aid in chemical bonding of an organic resin, such as epoxy, with an inorganic material, such as glass. This bonding can prevent formation of voids at the glass/resin interface, by increasing miscibility and thereby transmittance. This bonding also can increase moisture resistance and mechanical strength of the encapsulant, and thereby its durability. Examples of such agents are aminopropyltriethoxysilane, vinyltrimethoxysilane, methacryloxy propyltriethoxysilane, and 3-glycidoxypropyltrimethoxysilane. Aminopropyltriethoxysilane and 3-glycidoxypropyltrimethoxysilane are most preferred of these. These agents can be mixed with components of the encapsulant at different stages of its preparation. For example, these agents can be reacted with filler particles prior to their mixing with the epoxy resin composition, or they can be mixed with the epoxy resin composition before mixing the resin with the filler. In the most preferred process, the filler particles are first reacted with a silane coupling agent in a mixer, then heat-treated at about 100° C. for about 1 hour, and finally dispersed in the epoxy resin composition.

The epoxy resin composition comprises the following three components:
 (a) at least one epoxy resin,
 (b) at least one hardener (curing agent), and
 (c) at least one accelerator (catalyst).

Examples of suitable epoxy resins are bisphenol A epoxy resins; bisphenol F epoxy resins; bisphenol S epoxy resins; hydrogenated bisphenol A epoxy resins; novolac epoxy resins such as phenolic novolac epoxy resins and cresol novolac epoxy resins; cyclo-aliphatic epoxy resins; nitrogen-containing epoxy resins such as triglycidyl isocyanurate and hydantoin epoxy resins; aliphatic epoxy resins; glycidyl ether epoxy resins; biphenyl epoxy resins; dicyclo epoxy resins; naphthalene epoxy resins; and mixtures thereof. More preferable epoxy resins are bisphenol-A epoxy resins, novolac epoxy resins, cyclo-aliphatic epoxy resins, triglycidyl isocyanurate and mixtures thereof. Binary mixtures of bisphenol-A epoxy resins and cyclo-aliphatic epoxy resins, binary mixtures of bisphenol-A epoxy resins and triglycidyl isocyanurate, and ternary mixtures of bisphenol-A epoxy resins, cyclo-aliphatic epoxy resins, and triglycidyl isocyanurate are most preferable epoxy resins. Bisphenol-A resins such as diglycidyl ether of bisphenol-A (DGEBPA) resins are commercially available from Resolution Performance Products of Houston, Tex. with trade names such as EPON 825 or EPON 3002 (E3002). Cyclo-aliphatic epoxy resins, such as CY 179 MA (CY179) are marketed by Ciba Specialty Chemicals, Tarrytown, N.Y., or ERL-4221E marketed by Dow Chemical Company, Midland, Mich. Triglycidyl isocyanurate (TIC) can be obtained from Aldrich, Milwaukee, Wis., U.S.A. under a catalog number 37,950-6.

Acid anhydride hardeners and phenolic hardeners are the preferred hardeners. Examples of such hardeners are phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride, phenolic novolac resin hardeners, and mixtures thereof. More preferred hardeners are phthalic anhydride, hexahydrophthalic anhydride, tetrahydrophthalic anhydride, methylhexahydrophthalic anhydride, phenolic novolac resin hardeners, and mixtures thereof. The most preferred hardener is hexahydrophthalic anhydride (HHPA), which is commercially available from Lonza Chemicals, Basel, Switzerland.

Preferred accelerators are 1,8-diazabicyclo[5,4,0]undecene-7, triethylenediamine, tertiary amines such as tri-2,4,6-dimethylaminomethylphenol, imidazole derivatives such as 2-ethyl-4-methylimidazole and 2-methylimidazole, phosphorus compounds such as triphenylphosphite, tetraphenylphosphonium tetraphenylborate, and tetra-n-butylphosphonium O,O-diethyl phosphorodithioate, quaternary ammonium salts, organic metal salts such as zinc stearate, and mixtures thereof. More preferred accelerators are the tertiary amines, imidazole derivatives, phosphorus compounds, and mixtures thereof. Most preferred accelerators are triphenylphosphite (TPPP), 2-ethyl-4-methylimidazole (2E4M), and mixtures thereof. TPPP can be commercially obtained from GE Specialty Chemicals, Morgantown, W. Va. 2E4M can be obtained from Aldrich, Milwaukee, Wis., under catalog number E3,665-2.

Components (a) to (c) of the epoxy resin composition, listed above, have different refractive indices. They are combined in specific proportions to provide an epoxy resin composition at a cured stage having a refractive index closely matching that of the filler described above. As a practical matter, it is not possible to directly measure the refractive index of the filler particles with sufficient precision, and this index might not be identical to that of the glass from which the filler is prepared. Therefore, the proportions of components (a) to (c) are determined experimentally, so that the resulting encapsulant provides for acceptable, and preferably maximum, light transmittance when the particular epoxy resin composition is used with a particular filler.

Mixing of the glass filler and the liquid epoxy resin composition under the considerations discussed above produces the filled epoxy resin composition of the present invention. The filled epoxy resin composition is then placed over a suitable optoelectronic device using various methods known in the art, such as transfer molding, casting, potting, and dip-coating. Eventual solidification and curing of the filled epoxy resin compositions yield an optoelectronic device encased in the encapsulants of the present invention.

The production rate can be increased by using transfer molding. Therefore, transfer molding is a more suitable encapsulation method for manufacturing of optoelectronic devices. Encapsulation by transfer molding is achieved by first melting the partially-cured filled epoxy resin compositions in an enclosed chamber, then flowing the viscous liquid thereby obtained into an enclosed mold through an enclosed conduit by applying a pressure, encapsulating the optoelectronic device in this mold with the viscous liquid, and finally curing the liquid filled epoxy resin composition and removing the encapsulated device out of the mold. To have a high production rate, the amount of the encapsulant remaining in the melting chamber, the conduit, and the molding chamber (i.e., runner and cavity areas) as a residue should be minimized to reduce the time spent for cleaning after the encapsulation process. The viscous liquid also should not leak around the plunger used to apply pressure. Otherwise, the liquid encapsulant solidifies around the plunger and thereby damages the transfer molding equipment. Most importantly, damage to the device caused by flowing viscous liquid should also be prevented.

After the molding process, the encapsulant should be sufficiently hard for handling, to prevent additional damage. The ternary mixtures of bisphenol-A epoxy resins, cyclo-aliphatic epoxy resins, and triglycidyl isocyanurate have been found to be more preferred epoxy resin components for use in preparation of the filled epoxy resin compositions suitable for transfer molding process. The binary mixtures of bisphenol-A epoxy resins and cyclo-aliphatic epoxy resins, and binary mixtures of bisphenol-A epoxy resins and triglycidyl isocyanurate, alternatively can be used in preparation of encapsulants for transfer molding, but with decreasing production rate. Both of these binary epoxy resin mixtures and ternary epoxy resin mixtures can be used in preparation of filled epoxy resin compositions suitable for casting, potting, and dip-coating.

To prepare suitable epoxy resin composition for use with the present invention, the following compositional molar ratios for preparation of the binary epoxy resin mixtures or ternary epoxy resin mixtures are used.

The ratio by molar amount of bisphenol-A resin to combined molar amount of bisphenol-A resin and cyclo-aliphatic epoxy resin preferably has a value in the range of 0.001 to 0.900 and more preferably in the range of 0.10 to 0.25. The ratio by molar amount of hardener to combined molar amount of bisphenol-A resin and cyclo-aliphatic epoxy resin preferably has a value in the range of 0.100 to 1.177 and more preferably in the range of 0.500 to 0.900. The ratio by molar amount of accelerator to combined molar amount of bisphenol-A resin and cyclo-aliphatic epoxy resin preferably has a value in the range of 0.0005 to 0.0400 and more preferably in the range of 0.0030 to 0.0250.

The ratio by molar amount of bisphenol-A resin to combined molar amount of bisphenol-A resin, cyclo-aliphatic epoxy resin, and triglycidyl isocyanurate resin preferably is in the range of 0.05 to 0.6, and more preferably is in the range of 0.15 to 0.40. Further, the ratio by molar amount of cyclo-aliphatic epoxy resin to combined molar amount of bisphenol-A resin, cyclo-aliphatic epoxy resin, and triglycidyl isocyanurate resin preferably is in the range of 0.05 to 0.7, and more preferably is in the range of 0.10 to 0.55. Further, the ratio by molar amount of triglycidyl isocyanurate resin to combined molar amount of bisphenol-A resin, cyclo-aliphatic epoxy resin, and triglycidyl isocyanurate resin preferably is in the range of 0.05 to 0.70, and more preferably is in the range of 0.20 to 0.65. Further, the ratio by molar amount of hardener to combined molar amount of bisphenol-A resin, cyclo-aliphatic epoxy resin, and triglycidyl isocyanurate resin preferably is in the range of 0.50 to 1.20, and more preferably is in the range of 0.70 to 1.00. Finally, the ratio by molar amount of accelerator to combined molar amount of diglycidyl ether of bisphenol-A resin, cyclo-aliphatic epoxy resin, and triglycidyl isocyanurate resin preferably is in the range of 0.001 and 0.050, and more preferably is in the range of 0.004 and 0.030.

After mixing of the glass filler with the liquid epoxy resin composition and before the solidification of this suspension, the filler particles can settle down at the bottom of the liquid due to gravity. This settling causes non-uniform distribution of the filler particles in the encapsulant, which results in non-uniform CTE and which can eventually damage the encapsulated device during use. This settling can be partially or completely prevented by slowing the settling velocity of the particles in the liquid epoxy resin composition. The settling velocity of solid particles in a liquid can be calculated from Stokes' law, $$u_t = \frac{D_P^2 g(\rho_P - \rho)}{18\mu}$$

where, $u_t$ is the settling velocity, $D_p$ is the characteristic diameter of the filler particle, g is the gravitational constant, $\rho_p$ is the density of the filler particle, $\rho$ is the density of the liquid encapsulant, and $\mu$ is the viscosity of the liquid encapsulant.

Table 1 below provides the settling velocities, in units of mm/min, of the borosilicate particles in the liquid epoxy resin composition described below in EXAMPLE 1. In EXAMPLE 1, the borosilicate glass has a density of about 2.72 g/cm³, and the epoxy resin composition has a density of about 1.32 g/cm³. The settling velocities in Table 1 are calculated for particle sizes varying between 1 μm and 500 μm, and for viscosity of the liquid epoxy resin composition varying between 100 cP and 20,000 cP.

TABLE 1

| Viscosity of Liquid Epoxy Resin Composition, cP | Borosilicate Filler Particle Size, μm | | | | | |
| --- | --- | --- | --- | --- | --- | --- |
| | 1 | 20 | 50 | 100 | 250 | 500 |
| 100 | 0.0005 | 0.183 | 1.145 | 4.578 | 28.613 | 114.450 |
| 250 | 0.0002 | 0.073 | 0.458 | 1.831 | 11.445 | 45.780 |
| 500 | 0.0001 | 0.037 | 0.229 | 0.916 | 5.723 | 22.890 |
| 750 | 0.0001 | 0.024 | 0.153 | 0.610 | 3.815 | 15.260 |
| 1,000 | 0.0000 | 0.018 | 0.114 | 0.458 | 2.861 | 11.445 |
| 2,000 | 0.0000 | 0.009 | 0.057 | 0.229 | 1.431 | 5.723 |
| 3,000 | 0.0000 | 0.006 | 0.038 | 0.153 | 0.954 | 3.815 |
| 4,000 | 0.0000 | 0.005 | 0.029 | 0.114 | 0.715 | 2.861 |
| 5,000 | 0.0000 | 0.004 | 0.023 | 0.092 | 0.572 | 2.289 |
| 10,000 | 0.0000 | 0.002 | 0.011 | 0.046 | 0.286 | 1.145 |
| 20,000 | 0.0000 | 0.001 | 0.006 | 0.023 | 0.143 | 0.572 |

To achieve uniform dispersion of the filler particles in the solid encapsulant, the settling velocities preferably are less than 11 mm/min, more preferably are less than 6 mm/min, and most preferably are less than 4 mm/min. For example, according to Table 1, such settling velocities can be achieved by using borosilicate particles having sizes preferably less than 500 μm, and most preferably less than 250 μm, and liquid epoxy viscosities preferably higher than 300 cP, more preferably higher than 500 cP, and most preferably higher than 750 cP.

Use of very small filler particles is avoided to prevent particle agglomerations or bubble entrapments that can cause non-uniform particle dispersion or low transmittance. Therefore, particle sizes preferably are larger than 1 μm, and most preferably are larger the 10 μm.

Liquid resin compositions having very high viscosity are avoided, to allow easy mixing of the filler particles with the liquid epoxy resin composition, and also to allow easy defoaming of the resulting suspension if air bubbles are entrapped in the filled epoxy resin composition during the mixing. These bubbles are optionally removed from the liquid to increase transmittance. This is achieved using various methods known in the art, such as defoaming in vacuum and bubbling with helium. Therefore, the viscosities of the epoxy resin compositions preferably are lower than about 40,000 cP, more preferably are lower than about 20,000 cP, and most preferably are lower than about 10,000 cP.

Thus, to obtain uniform dispersion of the filler in the encapsulant, to prevent entrapment of air bubbles, and to achieve uniform encapsulant CTEs having variations preferably below about±30%, and most preferably below about±10%, the filler particle sizes preferably are smaller than 500 μm, more preferably are smaller than 250 μm, and most preferably are smaller than 125 μm; and the liquid epoxy viscosities preferably are between 300 cP and 40,000 cP, more preferably are between 500 cP and 20,000 cP, and most preferably are between 750 cP and 10,000 cP.

Liquid epoxy resin compositions having the preferred viscosities sometimes are obtained simply by directly mixing the components. However, liquid epoxy resin compositions having the preferred viscosities are more typically obtained by reacting the liquid epoxy resin composition with an accelerator, at a temperature in the range of preferably 80° C. to 140° C., more preferably 90° C. to 110° C., and most preferably about 100° C., for a predetermined period. As an example, FIG. 1 shows the relationship between reaction time and viscosity of the liquid epoxy resin composition, for three distinct reaction temperatures. In these three examples, the reaction times (in minutes) required to attain the preferred liquid epoxy resin composition before addition of the filler particles, are shown in Table 2.

TABLE 2

| Reaction Temperature | Viscosity of Liquid Epoxy Composition | | |
| --- | --- | --- | --- |
| | 300 cP | 500 cP | 750 cP |
| 90° C. | 65 | 100 | 128 |
| 100° C. | 65 | 85 | 108 |
| 110° C. | 51 | 60 | 68 |

Figure 2:
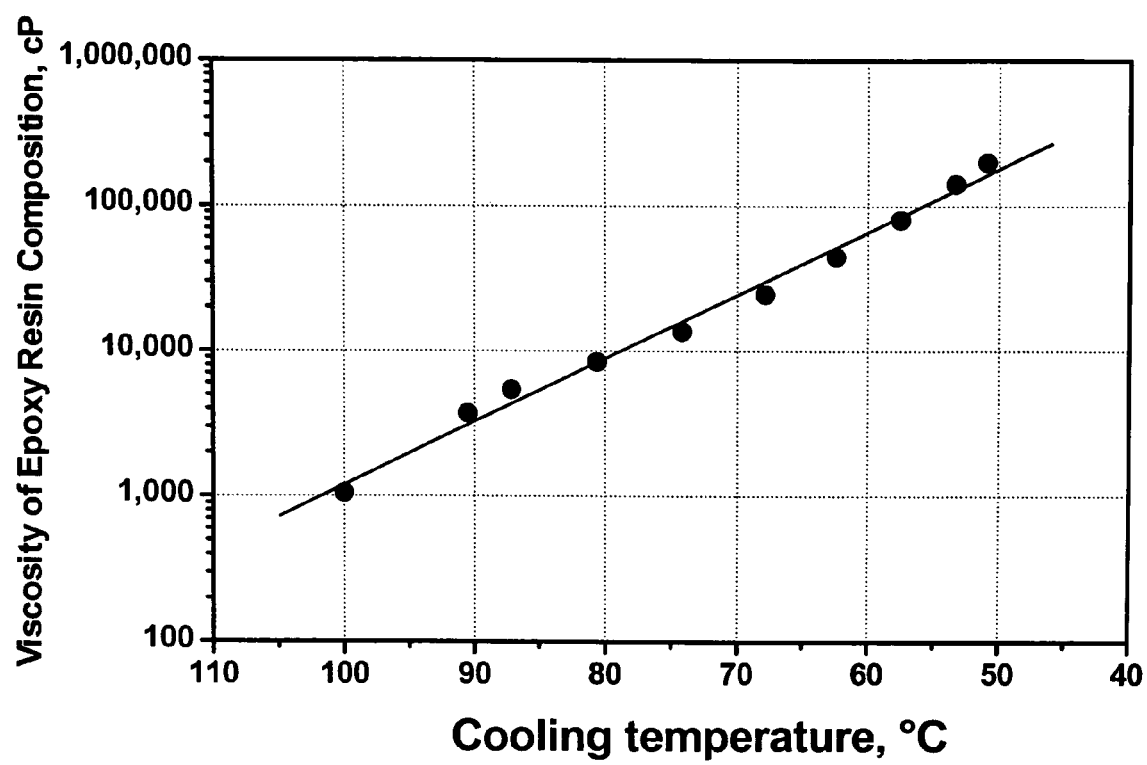
FIG. 2 is a graphical representation of the relationship between cooling temperature and viscosity of a liquid epoxy resin composition prepared in the same manner as described in EXAMPLE 1, reacted at 100° C. for about 120 minutes after addition of the accelerator.

Before mixing, the glass filler is heated to a temperature preferably between 20° C. and the reaction temperature of the liquid epoxy resin composition, more preferably between 50° C. and such reaction temperature, and most preferably between 60° C. and such reaction temperature. After mixing, the liquid suspension is cooled to a predetermined temperature, to further increase the composition's viscosity and thereby prevent settling of the filler particles. As an example, the relationship between the cooling temperature and the viscosity of the liquid epoxy resin composition is illustrated in FIG. 2. The cooling temperature is predetermined according to the viscosity of the liquid epoxy resin composition. Cooling temperatures that yield viscosities preferably between 1,000 cP and 40,000 cP, more preferably between 5,000 cP and 20,000 cP, and most preferably between 7,000 and 12,000 cP, are within the scope of this invention. The suspension then is optionally defoamed at this predetermined cooling temperature. The suspension preferably is stirred during the cooling and the optional defoaming, to prevent settling of the filler particles.

The cooling and optional defoaming of the suspension is completed preferably within about 120 minutes, more preferably within about 60 minutes, and most preferably within about 30 minutes, to prevent settling of the filler particles in the liquid epoxy resin composition.

The filled epoxy resin composition is placed on the surfaces of suitable optoelectronic devices using various encapsulation methods known in the art, such as transfer molding, casting, potting, and dip-coating. For transfer molding, the liquid filled epoxy resin composition preferably is cast into molds, cooled to room temperature, and thereby solidified to form pellets. The pellets are optionally partially-cured at about 45° C. after this casting. Later, during the transfer molding of the device, these pellets are melted into a liquid and then placed on the device. The filled epoxy resin composition is at a partially-cured stage after the encapsulation of the optoelectronic device. Eventual solidification of the liquid filled epoxy resin composition and a step of curing yield the encapsulated optoelectronic device.

Matching the refractive index of the epoxy resin composition at the cured stage to that of the glass filler yields an encapsulating material having high transmittance. This transmittance preferably is higher than about 20%, more preferably is higher than about 40%, and most preferably is higher than about 60%, at a wavelength in the range of 400 nm to 900 nm, when measured across a 1 mm thick sample of encapsulant.

Because the filler and the epoxy resin composition at the cured stage are prepared to have closely matched refractive indices, the relative amount of the filler material in the encapsulant can be varied substantially without significant effect on the encapsulant's light transmittance. Therefore, the relative amount of filler can be varied to adjust the CTE of the resulting encapsulant to preferably less than about 50 ppm/° C., and most preferably less than about 40 ppm/° C. The relative amount of filler in the encapsulant preferably ranges between 5% and 60% by volume of the encapsulant, more preferably between 10% and 50% by volume, and most preferably between 15% and 40% by volume.

In addition to the advantages described above, the most preferred encapsulants incorporate alkali-free borosilicate glass in the filler, which provides a high electrical resistivity, in contrast to other possible glasses. Encapsulants produced according to the method have a high tolerance for high temperature and high humidity environments, which results in stable optical and physical properties under a variety of environmental conditions.

Because of their low CTE and high transmittance, encapsulants within the scope of the present invention also can be used in the manufacturing of optical components such as lenses, prisms, mirror substrates, and similar products. When not used with an electronic device or in an application for which electrical insulation properties are not important, such encapsulants also can incorporate high-alkali glasses as fillers.

In the following examples, the molar ratios are estimated using 555 grams/mole for the molecular weight of diglycidyl ether of bisphenol-A resin (E3002), 133 grams/mole for cyclo-aliphatic epoxy resin (CY179), 100 grams/mole for triglycidyl isocyanurate (TIC), 154 grams/mole for hexahydrophthalic anhydride (HHPA), 262 grams/mole for triphenylphosphite (TPPP), and 110 grams/mole for 2-ethyl-4-methylimidazole (2E4M).

EXAMPLE 1

Encapsulant Prepared from a Binary Epoxy Mixture

An encapsulant prepared from a binary epoxy mixture within the scope of the present invention is prepared in this illustrative Example.

Figure 3:
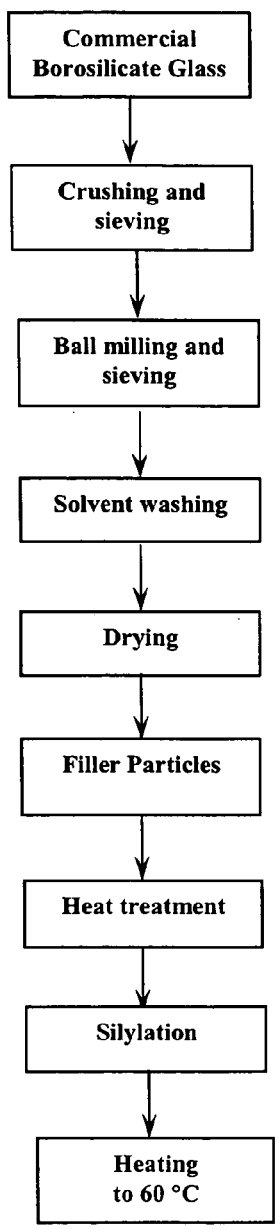
FIG. 3 is a schematic flowchart depicting the successive steps of a method for preparing the borosilicate glass filler as described in EXAMPLE 1.
Figure 4:
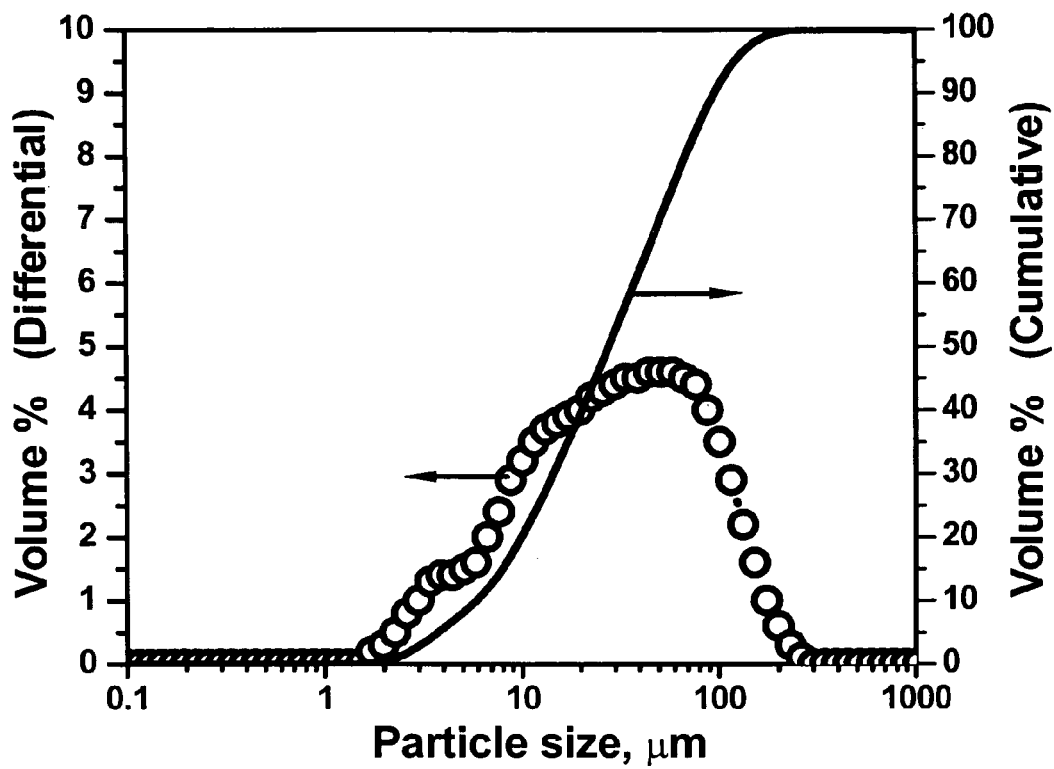
FIG. 4 is a graphical representation of the size distribution of filler particles prepared within the scope of the present invention, after the step of ball milling.

Preparation of the Filler Particles:

The process of preparing the glass filler particles is illustrated schematically by the flowchart depicted in FIG. 3. A commercial, alkali-free borosilicate glass sheet, marketed under the trademark AF45 by Schott Corporation, having an average refractive index of about 1.526 at about 588 nm and at about 25° C., and having a refractive index variation within the glass of less than about 0.001, is crushed into coarse particles and then sieved through a #8 mesh sieve to eliminate all particles larger than about 2.36 mm in diameter. These sieved particles are placed in a 100 ml zirconia milling jar, along with 3 milling balls having diameters of 20 mm and 15 milling balls having diameters of 15 mm. The particles then are planetary ball-milled at about 200 rpm for about 30 minutes. The size distribution of particles obtained after the step of ball-milling is determined using a particle size analyzer (model LA-900, marketed by Horiba Incorporated of Irvine, Calif.). As shown in FIG. 4, the particle sizes of the resulting white powder ranges between 1 µm and 300 µm, with a peak at about 50 µm.

Figure 5:
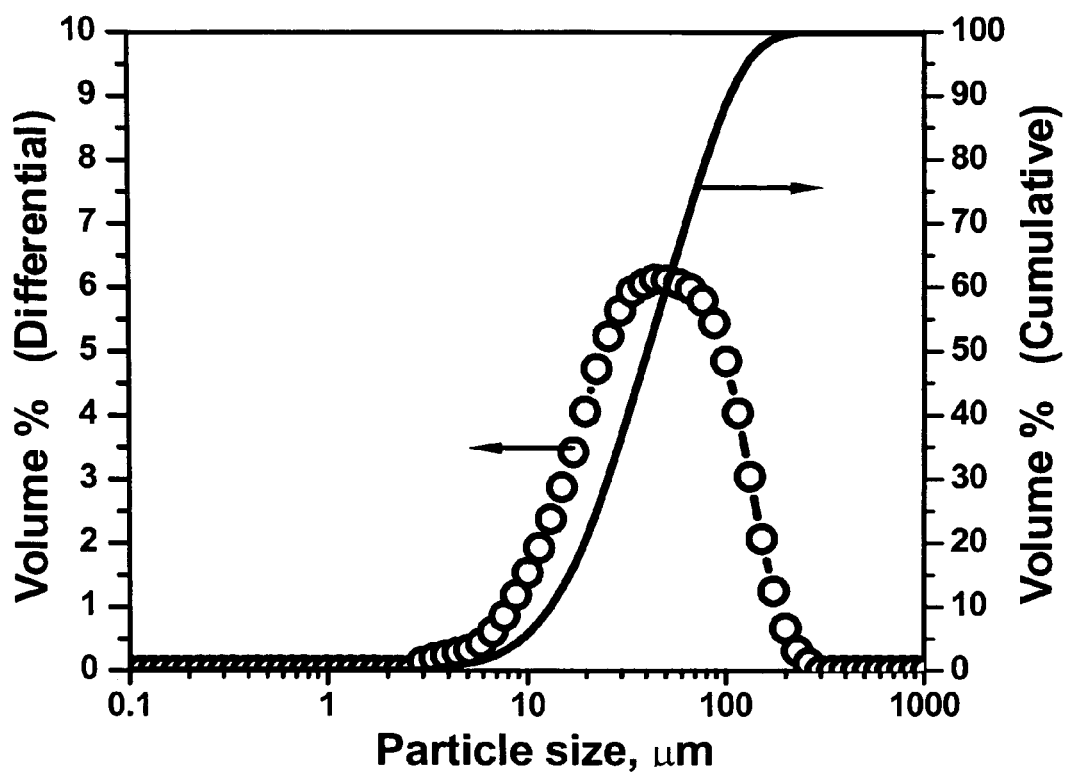
FIG. 5 is a graphical representation of the size distribution of filler particles prepared within the scope of the present invention, after the steps of sieving and solvent washing.

Next, all of the milled particles larger than about 250 µm in diameter are removed via sieving. The content of particles smaller than about 10 µm in diameter in the filler is decreased using a solvent wash. This washed powder is dried at a temperature of about 160° C. for about 12 hours. The size distribution of particles obtained after the steps of solvent washing and drying is shown in FIG. 5. The particle sizes of the resulting white powder ranged between 2 µm and 250 µm, with a peak at about 50 µm. Six volume percent of this powder is composed of particles having sizes smaller than about 10 µm. Thereafter, the particles are optionally heat-treated at a temperature of about 500° C. for about 36 hours in dry air.

After heat treatment, the dried filler particles are silylated with a silane coupling agent, as follows. The filler particles are first mixed with aminopropyltriethoxysilane in a hybrid mixer (Model No. AR-250, marketed by Thinky Corporation of Tokyo, Japan) for about 2 minutes at a temperature of about 20° C. In this preparation, about 1 gram of aminopropyltriethoxysilane is used per about 99 grams of filler. Finally, the particles are heat-treated at a temperature of about 60° C. for about 1 hour in air to complete the step of silylation.

Figure 6:
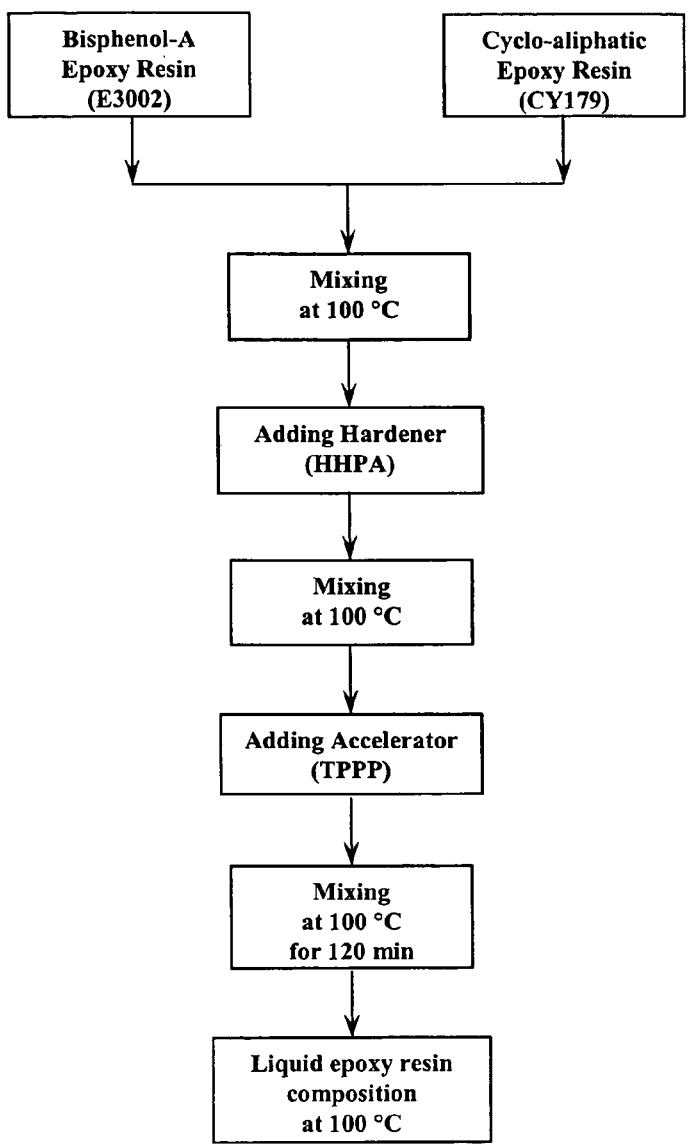
FIG. 6 is a schematic flowchart depicting the successive steps of a method for preparing the epoxy resin composition as described in EXAMPLE 1.

Preparation of the Binary Epoxy Resin Composition:

The process of preparing the liquid binary epoxy resin composition is illustrated schematically in FIG. 6. This epoxy resin composition is prepared using the following ingredients: a diglycidyl ether of bisphenol-A resin (E3002), a cyclo-aliphatic epoxy resin (CY179), a hardener (HHPA), and an accelerator (TPPP). The epoxy resin composition is prepared by combining about 43 grams of E3002 and about 64.5 grams of CY179 in a closed container. The container is placed in an ethylene glycol bath at a temperature of about 100° C., and the two components are mixed at about 300 rpm for about 60 minutes. Next, about 67.5 grams of HHPA are added to the solution, and the solution is stirred at about 300 rpm for about 5 minutes. Finally, about 1.08 gram of TPPP is added to the solution, and the solution is stirred for about 120 minutes at about 300 rpm, to form the epoxy resin composition. The molar ratios of this epoxy resin composition are about 0.139 for E3002, about 0.861 for CY179, about 0.781 for HHPA, and about 0.0073 for TPPP.

In addition to the preparation described above, three additional epoxy resin compositions are prepared in the same manner. After addition of the accelerator, these epoxy resin compositions are reacted at about 90° C. for about 0.255 minutes, at about 100° C. for about 182 minutes, and at about 110° C. for about 103.5 minutes respectively. The effects of the reaction time and the reaction temperature on the viscosity of these liquid epoxy resin compositions are illustrated in FIG. 1. The viscosity of the epoxy resin composition is measured using a viscometer (Model No. LVDV-II+), a spindle (Model No. SC4-18), and a chamber (Model No. SC4-13RPY), all manufactured by Brookfield Engineering Labs Incorporated of Middleboro, Mass. After mixing the accelerator, the liquid epoxy resin compositions each are placed into the chamber of the viscometer, which had been preheated to the reaction temperature. A shear rate of about 2.0 seconds$^{-1}$ is applied to measure the viscosities below about 900 cP, about 0.8 seconds$^{-1}$ to measure the viscosities varying in the range of 900 cP to 2,000 cP, and about 0.4 seconds$^{-1}$ to measure the viscosities above about 2,000 cP.

Figure 7:
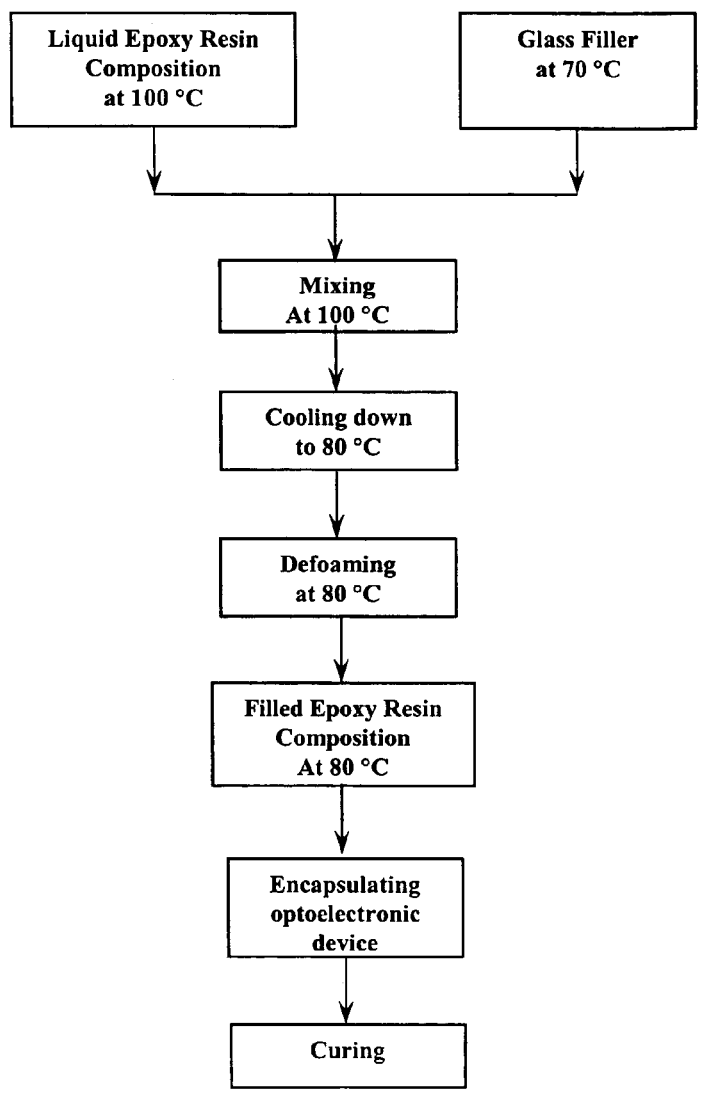
FIG. 7 is a schematic flowchart depicting the successive steps of a method for preparing the encapsulant as described in EXAMPLE 1.

Mixing Filler and Epoxy Resin Composition to Produce Filled Epoxy Resin Composition:

The process of mixing the filler particles and the liquid epoxy resin composition is schematically illustrated in FIG. 7. This epoxy resin composition is reacted at about 100° C. for about 120 minutes after addition of the accelerator. The viscosity of this epoxy resin composition, measured at about 100° C. is found to be about 1,020 cP at a shear rate of about 0.8 second$^{-1}$. About 30 grams of this epoxy resin composition are combined with about 20 grams of the filler. The resulting liquid suspension had a filler content of about 16 volume percent. The liquid suspension is mixed in the hybrid mixer for about 2 minutes, followed by cooling down and defoaming in vacuum in an oven at a temperature of about 80° C. for about 20 minutes. The liquid suspension is stirred during the steps of cooling and defoaming. In a separate experiment, a liquid epoxy resin composition having the same composition is reacted at about 100° C. for about 120 minutes in the chamber of the viscometer, and then cooled down from about 100° C. to a temperature of about 50° C. During this cooling, the viscosity of the epoxy resin composition is measured in the manner described above. The viscosity of the epoxy resin composition (without the filler) is about 8,750 cP at about 80° C. at a shear rate of about 0.4 second$^{-1}$. The resulting hot viscous suspension at about 80° C. is cast into sample molds which had been maintained at a room temperature of about 20° C. Finally, the filled epoxy resin composition is partially-cured at a temperature of about 70° C. for about 2 hours, and then cured at a temperature of about 165° C. for about 4 hours. The encapsulant thereby obtained had dimensions of about 13 mm diameter and about 14 mm length.

Three samples having a thickness of about 1 mm are cut from this encapsulant, one each from the top, middle, and bottom. The CTE of these three samples is measured using a dynamic mechanical analyzer, Model No. DMA 7e, and a 2 millimeter quartz penetration probe, both manufactured by Perkin Elmer Analytical Instruments of Shelton, Conn. The sample is heated from about 30° C. to about 190° C., with a heating rate of about 3° C./min. During the measurements, a force of about 220 milliNewtons is applied to the probe. The slope of the linear line obtained by best fit to the temperature versus linear thermal expansion data in the temperature range of 30° C. to 100° C. yields the CTE value of the encapsulant. The CTE is about 39.2 ppm/° C. in the top section of the encapsulant, about 38.7 ppm/° C. in the middle section, and about 38.4 ppm/° C. in the bottom section. The average CTE value for this encapsulant is about 38.8 ppm/° C., with a CTE variation of less than about±1% over its entire volume. This CTE measurement confirmed that the filler particles are generally uniformly dispersed in the encapsulant. The same dynamic mechanical analyzer measurement is used to determine that the Tg of the encapsulant sample is about 164° C. The transmittance of the encapsulant is measured at a temperature of about 20° C. using a visible light spectrometer (Cary 500 Scan, marketed by Varian Inc. of Palo Alto, Calif.). A sample of the encapsulant having a thickness of about 1 millimeter has a transmittance of about 85% when measured at a wavelength of about 650 nm, and about 72% when measured at a wavelength of about 450 nm.

COMPARATIVE EXAMPLE 1

Low Viscosity

An encapsulant is prepared and analyzed in the same manner as in EXAMPLE 1, except that after the addition of TPPP, the solution is stirred at 100° C. for about 25 minutes, instead of about 120 minutes. The viscosity of the resulting epoxy resin composition is about 151 cP at a shear rate of about 2.0 seconds$^{-1}$ and at about 100° C. Properties of the encapsulant, the filler, and, the epoxy resin composition prepared in this comparative example, are shown in Table 3. The CTE is about 62.0 ppm/° C. in the top section of the encapsulant, about 35.0 ppm/° C. in the middle section, and about 7.5 ppm/° C. in the bottom section. The average CTE value for this encapsulant is about 34.8 ppm/° C., with a variation of about±78% over its entire volume. The results of this comparative example indicates that the filler particles settle at the bottom of the epoxy resin composition before it solidifies. This epoxy resin composition has a low viscosity before it is mixed with the filler, which leads to rapid gravitational settling of the particles and non-uniform distribution of the filler particles in the encapsulant. The variation of the CTE therefore is unacceptably high for encasing of optoelectronic devices.

COMPARATIVE EXAMPLE 2

Filler Size Greater than 250 µm

An encapsulant is prepared and analyzed in the same manner as in EXAMPLE 1, except that the particles removed after the step of ball-milling and sieving in EXAMPLE 1 are used in this comparative example as a filler. This filler includes particles having sizes larger than about 250 µm. Properties of the encapsulant, the filler, and, the epoxy resin composition, which are prepared in this example, are shown in Table 3. The CTE is about 62.0 ppm/° C. in the top section of the encapsulant, about 37.0 ppm/° C. in the middle section, and about 15.0 ppm/° C. in the bottom section. The average CTE is about 38.5 ppm/° C., with a CTE variation of about±61% over the entire volume of the encapsulant. This variation is caused by gravitational settling of particles larger than about 250 µm, which occurs after the filler is mixed with the epoxy resin composition. This settling leads to non-uniform dispersion of the filler particles in the encapsulant and results in non-uniform CTE in the encapsulant. This encapsulant is not suitable for encasing of optoelectronic devices, because it has non-uniform CTE.

EXAMPLE 2

Filler Size Between 1 µm and 100 µm

Figure 8:
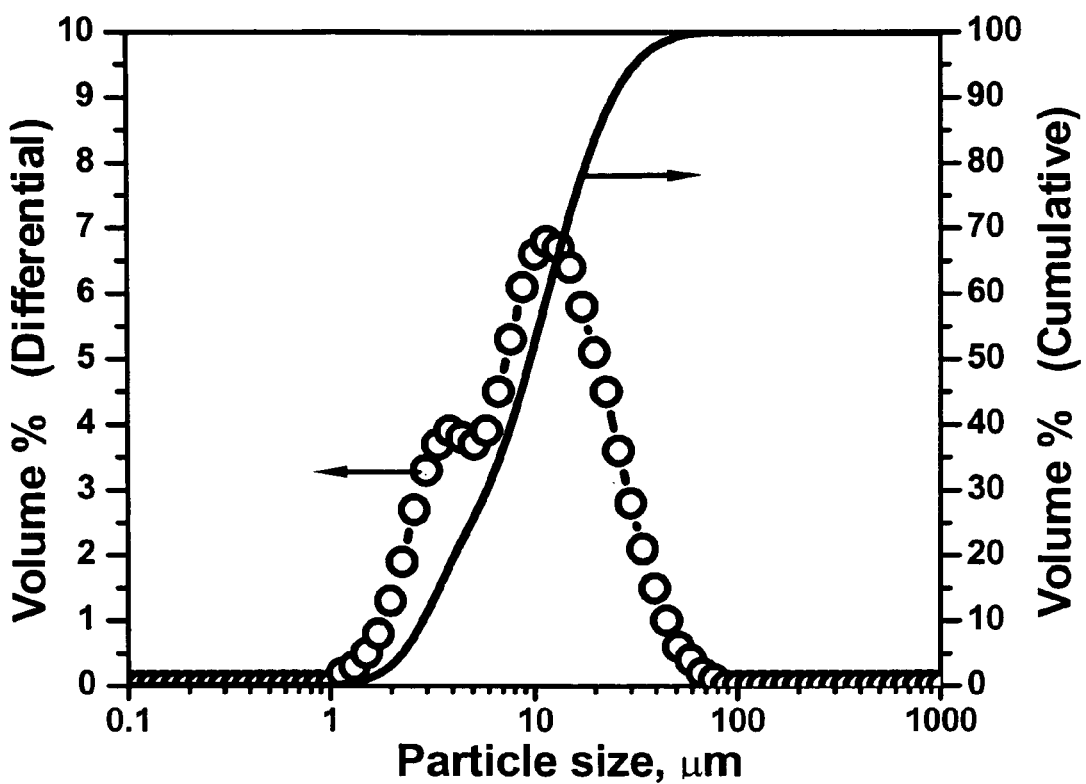
FIG. 8 is a graphical representation of the size distribution of filler particles prepared within the scope of the present invention, obtained by filtering the solvent used for washing in the step of solvent washing.

An encapsulant is prepared and analyzed in the same manner as in EXAMPLE 1, except that the filler particles remaining in the solvent used in the step of solvent washing are used as filler. These particles are recovered by filtration and drying of the solvent. As shown in FIG. 8, the sizes of these particles ranges between 1 µm and 100 µm, with a peak at about 10 µm, as determined by the particle size analyzer. About 60% by volume of this powder is composed of particles having sizes less than about 10 µm. Properties of the encapsulant, the filler, and the epoxy resin composition prepared in this example, are shown in Table 3. The transmittance of the resulting encapsulant is about 48% and within the scope of this present invention. The results from this example shows that the particles smaller than about 10 µm are agglomerated in the encapsulant, which leads to a decrease in the transmittance.

Taken together, the results of EXAMPLES 1 and 2 and COMPARATIVE EXAMPLE 2 indicate that the preferred size range for the filler particles is between 1 µm and 500 µm. The more preferred size range is between 1 µm and 250 µm in diameter, and the most preferred size range is between 10 µm and 250 µm. These examples further demonstrate that the filler can contain particles having sizes less than 10 µm, with the resulting encapsulant providing acceptable CTE and transmittance properties. However, the amount of particles smaller than about 10 µm in the filler should be preferably less than about 60% by volume of the filler, more preferably less than about 20% by volume, and most preferably less than about 10% by volume.

COMPARATIVE EXAMPLE 3

Encapsulant Incorporating No Filler Particles

An encapsulant is prepared and analyzed in the same manner as in EXAMPLE 1, except that no filler particles are incorporated into the resulting encapsulant. Properties of the encapsulant, and the epoxy resin composition prepared in this example, are shown in Table 3. The transmittance of this encapsulant is about 91%. However, the average CTE is very high, about 62.0 ppm/° C.

COMPARATIVE EXAMPLE 4

Lower Filler Amount

An encapsulant is prepared and analyzed in the same manner as in EXAMPLE 1, except that the filler amount in the encapsulant is about 5% by volume, instead of about 16% by volume. Properties of the encapsulant, the filler, and the epoxy resin composition that are prepared in this example are shown in Table 3. The transmittance of this encapsulant is about 89.6%. The average CTE is about 55.6 ppm/° C., with a CTE variation of about±1%.

EXAMPLE 3

Higher Filler Amount

An encapsulant is prepared and analyzed in the same manner as in EXAMPLE 1, except that the filler amount in the encapsulant is about 46% by volume, instead of about 16% by volume. Properties of the encapsulant, the filler, and the epoxy resin composition prepared in this example are shown in Table 3. The transmittance of this encapsulant is about 79.2%. The average CTE is about 14.4 ppm/° C., with a CTE variation less than about±1%.

Taken together, EXAMPLES 1 and 3 demonstrate that a wide range of filler loading can be incorporated into the encapsulant while retaining high transmittance, thereby allowing adjustment of transmittance and CTE to meet varying requirements. Taken together, EXAMPLES 1 and 3 and COMPARATIVE EXAMPLES 3 and 4 demonstrate that the filler content of the encapsulants should be preferably between 5% and 60% by volume, more preferably between 10% and 50% by volume, and most preferably between 15% and 40% by volume, to obtain both the low CTE and the high transmittance within the scope of this invention.

EXAMPLE 4

No Heat Treatment

An encapsulant is prepared and analyzed in the same manner as in EXAMPLE 1, except that the filler is not heat-treated. This filler is kept in atmospheric air at a temperature of about 20° C. for about 1 hour before it is combined with the epoxy resin composition. Properties of the encapsulant, the filler, and the epoxy resin composition that are prepared in this example are shown in Table 3. The transmittance of this encapsulant is about 69.0%.

EXAMPLE 5

Heat Treatment at 350° C.

An encapsulant is prepared and analyzed in the same manner as in EXAMPLE 1, except that the filler is heat-treated for about 36 hours at about 350° C., instead of at about 500° C. Properties of the encapsulant, the filler, and the epoxy resin composition that are prepared in this example are shown in Table 3. The transmittance of this encapsulant is about 69.0%.

EXAMPLE 6

Heat Treatment at 650° C.

An encapsulant is prepared in the same manner as in EXAMPLE 1, except that the filler particles are heat-treated for 36 hours at a temperature of about 650° C., instead of about 500° C. This heat-treatment temperature is above the strain point of this glass, which is about 627° C. The resulting encapsulant has reduced transmittance of about 60.5%.

EXAMPLE 7

Heat Treatment at 750° C.

An encapsulant is prepared in the same manner as in EXAMPLE 1, except that the filler particles are heat-treated for about 36 hours at a temperature of about 750° C., instead of about 500° C. This heat-treatment temperature is above the strain point of this glass, which is about 627° C. and which approaches the glass softening temperature of about 883° C. This heat treatment causes visible aggregation of the filler particles. After some mild grinding to separate the filler particles, the encapsulant is produced as described in EXAMPLE 1. The resulting encapsulant has a reduced transmittance of about 46%. This lower transmittance is caused by the formation of air pockets between the aggregated particles. This result indicates that the heat treatment temperature should preferably be lower than the strain point of the glass.

Taken together, EXAMPLES 1, 4, and 5 demonstrate that the transmittance of the encapsulant can be maximized by heat-treatment of the filler particles. Taken together, EXAMPLES 6 and 7 demonstrate that the preferred maximum heat treatment temperature for the filler particles used in the encapsulant should be less than the glass softening point of the filler. The most preferred heat treatment temperature range is between 450° C. and 550° C., to maximize the transmittance of the resulting encapsulant.

EXAMPLES 8-12

Varying Molar Ratio of Epoxy Resin, E3002

Five encapsulants are prepared and analyzed in the same manner as in EXAMPLE 1, except that the molar ratio of E3002 is varied between about 0.001 and about 0.821. Properties of the encapsulants, the fillers, and the epoxy resin compositions prepared in this example are shown in Table 3. The variation of molar ratio of E3002 alters the refractive index of the epoxy resin composition at a cured stage, resulting in encapsulants having transmittances varying in the range of 22.0% to 78.1%.

Taken together, EXAMPLES 1 and 8-12 demonstrate that the molar ratio of E3002 epoxy resin should be preferably between 0.001 and 0.900. The molar ratio of E3002 epoxy resin should most preferably be between 0.10 and 0.25, to obtain an encapsulant having a transmittance higher than 60%.

COMPARATIVE EXAMPLE 5

Decreased Molar Ratio of Hardener, HHPA

An encapsulant is prepared in the same manner as in EXAMPLE 1, except that the molar amounts of the components of the epoxy resin composition are adjusted so that the molar ratio of the HHPA is about 0.062, instead of about 0.781. Properties of the encapsulant, the filler, and the epoxy resin composition prepared in this example are shown in Table 3. In this comparative example, the epoxy resin composition and the filler mixture do not cure into a solid encapsulant. The result of this example demonstrates that solid encapsulants cannot readily be prepared when the molar ratio of the hardener is lower than the preferred range of the present invention.

EXAMPLES 13-15

Varying Molar Ratio of Hardener HHPA

An encapsulant is prepared and analyzed in the same manner as in EXAMPLE 1, except that the molar ratio of the hardener HHPA is varied in the range of 0.583 to 1.177. Properties of the encapsulant, the filler, and the epoxy resin composition prepared in this example are shown in Table 3. This adjustment affects the refractive index of the epoxy resin composition at a cured stage, resulting in encapsulants having transmittance varying in the range of 21.8% to 73.8%.

Taken together EXAMPLES 1 and 13-15 and COMPARATIVE EXAMPLE 5 demonstrate that the molar ratio of the hardener should be preferably between 0.100 to 1.177. The most preferable molar ratio for the hardener is between 0.5 and 0.9, to obtain an encapsulant having a transmittance of higher than 60%.

TABLE 3

| | Encapsulant | | | Filler | | | | |
| | CTE | | | | Filler | Heat Treatment Conditions | | |
| Examples | Average ppm/° C. | Variation ± % | Transmittance* % | Particle Size μm | Amount Volume % | Temperature ° C. | Duration hours | Atmosphere |
| --- | --- | --- | --- | --- | --- | --- | --- | --- |
| Example 1 | 38.8 | 1 | 85.0 | 1-250 | 16 | 500 | 36 | Dry air |
| Comparative Example 1 | 34.8 | 78 | 85.0 | 1-250 | 16 | 500 | 36 | Dry air |
| Comparative Example 2 | 38.5 | 61 | 85.0 | >250 | 16 | 500 | 36 | Dry air |
| Example 2 | 38.8 | 1 | 48.0 | 1-90 | 16 | 500 | 36 | Dry air |
| Comparative Example 3 | 62.0 | 1 | 91.0 | No filler | | — | — | — |
| Comparative Example 4 | 55.1 | 1 | 89.6 | 1-250 | 5 | 500 | 36 | Dry air |
| Example 3 | 14.4 | 1 | 79.2 | 1-250 | 46 | 500 | 36 | Dry air |
| Example 4 | 38.8 | 1 | 69.0 | 1-250 | 16 | 20 | >1 | — |
| Example 5 | 38.8 | 1 | 69.0 | 1-250 | 16 | 350 | 36 | Dry air |
| Example 6 | 38.8 | 1 | 60.5 | 1-250 | 16 | 650 | 36 | Dry air |
| Example 7 | 38.8 | 1 | 46.0 | 1-250 | 16 | 750 | 36 | Dry air |
| Example 8 | 38.8 | 1 | 25.0 | 1-250 | 16 | 500 | 36 | Dry air |
| Example 9 | 38.8 | 1 | 76.5 | 1-250 | 16 | 500 | 36 | Dry air |
| Example 10 | 38.8 | 1 | 78.1 | 1-250 | 16 | 500 | 36 | Dry air |
| Example 11 | 38.8 | 1 | 64.1 | 1-250 | 16 | 500 | 36 | Dry air |
| Example 12 | 38.8 | 1 | 22.0 | 1-250 | 16 | 500 | 36 | Dry air |
| Comparative Example 5 | Encapsulant did not cure | | | 1-250 | 16 | 500 | 36 | Dry air |
| Example 13 | 38.8 | 1 | 73.8 | 1-250 | 16 | 500 | 36 | Dry air |
| Example 14 | 38.8 | 1 | 82.2 | 1-250 | 16 | 500 | 36 | Dry air |
| Example 15 | 38.8 | 1 | 21.8 | 1-250 | 16 | 500 | 36 | Dry air |

TABLE 3-continued

| | Binary Epoxy Mixture | | Hardener | Accelerator | Partial | |
|---|---|---|---|---|---|---|
| Examples | E3002 Mole | CY179 Mole | HHPA Mole | TPPP Mole | Curing Time minutes | Viscosity cP |
| Example 1 | 0.139 | 0.861 | 0.781 | 0.0073 | 120 | 1020 |
| Comparative Example 1 | 0.139 | 0.861 | 0.781 | 0.0073 | 25 | 151 |
| Comparative Example 2 | 0.139 | 0.861 | 0.781 | 0.0073 | 120 | 1020 |
| Example 2 | 0.139 | 0.861 | 0.781 | 0.0073 | 120 | 1020 |
| Comparative Example 3 | 0.139 | 0.861 | 0.781 | 0.0073 | 120 | 1020 |
| Comparative Example 4 | 0.139 | 0.861 | 0.781 | 0.0073 | 120 | 1020 |
| Example 3 | 0.139 | 0.861 | 0.781 | 0.0073 | 120 | 1020 |
| Example 4 | 0.139 | 0.861 | 0.781 | 0.0073 | 120 | 1020 |
| Example 5 | 0.139 | 0.861 | 0.781 | 0.0073 | 120 | 1020 |
| Example 6 | 0.139 | 0.861 | 0.781 | 0.0073 | 120 | 1020 |
| Example 7 | 0.139 | 0.861 | 0.781 | 0.0073 | 120 | 1020 |
| Example 8 | 0.001 | 0.999 | 0.781 | 0.0073 | 120 | — |
| Example 9 | 0.115 | 0.885 | 0.781 | 0.0073 | 120 | — |
| Example 10 | 0.165 | 0.835 | 0.781 | 0.0073 | 120 | — |
| Example 11 | 0.228 | 0.772 | 0.781 | 0.0073 | 120 | — |
| Example 12 | 0.821 | 0.179 | 0.781 | 0.0073 | 120 | — |
| Comparative Example 5 | 0.139 | 0.861 | 0.062 | 0.0073 | 120 | — |
| Example 13 | 0.139 | 0.861 | 0.583 | 0.0073 | 120 | — |
| Example 14 | 0.139 | 0.861 | 0.868 | 0.0073 | 120 | — |
| Example 15 | 0.139 | 0.861 | 1.177 | 0.0073 | 120 | — |

*Transmittance is measured at 650 nm for 1 mm thick encapsulant.

EXAMPLE 16

Use of Filler Glasses Containing Alkali Ions

In this example, several glass filler materials are used. These glasses include soda lime glass, marketed under the trademark K5 by Schott Corporation, and $ZnO$—$TiO_2$ glass, marketed under the product number 0211 by Corning Incorporated. The borosilicate glass used in preferred aspects of the present invention is alkali-free. The alkali content of the $ZnO$—$TiO_2$ glass is lower than 0.3% by weight, while the alkali content of the soda lime glass is very high, in the range of 13% to 17% by weight. The filler particles of each of these three glasses are prepared as described in EXAMPLE 1. The epoxy resin composition prepared is identical to that described in EXAMPLE 1, and three encapsulants containing about 40% by weight of each of the fillers are produced. A separate optoelectronic device is encased within each of the three encapsulants before the encapsulants are cured.

The optical transmittance of each of these three encapsulants is tested three different times: (1) immediately after the step of curing, (2) after holding the encapsulants at a temperature of about 85° C. in a relative humidity of about 85% for about 100 hours, and (3) after holding in these conditions for about 1,000 hours. The electrical resistivity of each of the three encapsulants also is tested at these same three times, by measuring leakage current, which is inversely related to electrical resistivity. These latter measurements are performed by attaching the optoelectronic devices to a test fixture (model HP 16442A, manufactured by Hewlett Packard Instruments Inc.), applying approximately 10 volts of potential across the device, and determining the leakage current using a precision semiconductor analyzer (model HP 4156A, manufactured by Hewlett Packard Instruments Inc.).

During this heat and humidity treatment of the encapsulated devices, a potential difference of about 5.25 volts is applied to the devices. The results of the transmittance measurements and the leakage current measurement are shown in Table 4.

TABLE 4

| Property | Alkali-free Borosilicate | $ZnO$—$TiO_2$ | Soda Lime |
|---|---|---|---|
| Alkali Content, wt % | None | Low: <0.3% | High: 13-17% |
| Transmittance (at 650 nm): | | | |
| As cured | 85 | 85 | 82 |
| After 100 h | 87 | 80 | 65 |
| After 1,000 h | 87 | 78 | 25 |
| Leakage Current (pA): | | | |
| As cured | 23 | 28 | 30 |
| After 100 h | 23 | 450 | 2,300 |
| After 1,000 h | 23 | 1,350 | 70,000 |

These results show that all three filler materials produced encapsulants having comparable low leakage current and high transmittance at the post-cured stage, but only the alkali-free borosilicate glass maintained these superior properties when exposed to high temperature and high humidity for an extended time. It appears that use in encapsulants of fillers incorporating alkali ions, such as sodium or potassium, leads to deterioration of the encapsulant's electrical insulation properties and transmittance, after extended exposure to high-humidity and high-temperature environments.

This example shows that the alkali-free and the titania-free glasses are the most preferred glasses for use in encapsulants for optoelectronic devices within the scope of this invention. Both such glasses provide high electrical resistivity and high transmittance, both initially after cure and after extended exposure to high-humidity and high-temperature environments. Other titania-free glasses, such as soda-lime glasses, also can be used as fillers of encapsulants for electronic devices of a kind that can tolerate low electrical resistivity, or as fillers of epoxies for applications not requiring electrical insulation, such as lenses.

EXAMPLE 17

Encapsulant Prepared from a Ternary Epoxy Mixture

Figure 9:
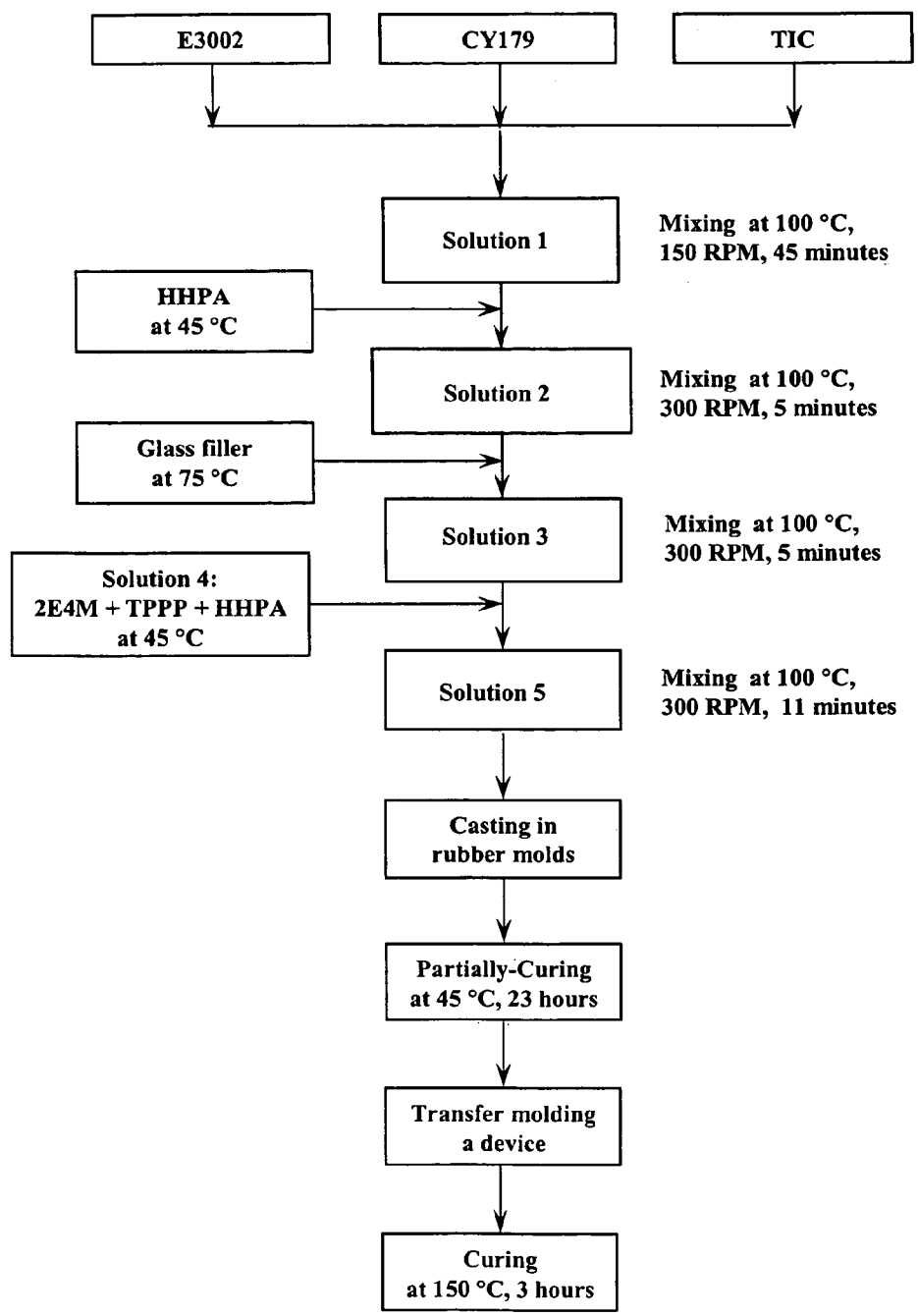
FIG. 9 is a schematic flowchart depicting the successive steps of a method for preparing the encapsulant as described in EXAMPLE 10.

An encapsulant from a ternary epoxy composition within the scope of the present invention is prepared in this Example. The process of preparing the encapsulant is illustrated schematically in FIG. 9.

Preparation of the Filler Particles:

A commercial alkali-free borosilicate glass sheet, marketed under the trademark AF45 by Schott Corporation, having an average refractive index of about 1.526 at about 588 nm and at about 25° C., and a refractive index variation within the glass of less than about 0.001, is crushed into coarse particles and then sieved through a #8 mesh sieve to eliminate all particles larger than about 2.36 mm in diameter. These sieved particles are laced in a 100-ml zirconia milling jar, along with three milling balls having a diameter of 20 mm and 15 milling balls having a diameter of 15 mm. The particles then are milled at about 200 rpm for about 30 minutes, using a planetary ball-mill (model PM400, Retsch GmbH, Germany). Next, all of the milled particles larger than about 125 μm in diameter are removed via sieving. The content of particles smaller than 10 μm in diameter in the filler is optionally decreased using a solvent wash. The washed powder is dried at a temperature of about 160° C. for about 12 hours.

The dried filler particles are silylated with a silane coupling agent, as follows. The filler particles are first mixed with 3-glycidoxypropyltrimethoxysilane (GPTMOS) in a hybrid mixer (Model No. AR-250, marketed by Thinky Corporation of Tokyo, Japan) for about 2 minutes at a room temperature of about 20° C. In this preparation, about 0.75 gram of GPTMOS is used per about 99.25 grams of filler. Finally, the particles are heat-treated at a temperature of about 75° C. for about 1 hour in air to complete the step of silylation.

Preparation of the Encapsulant:

A first solution is prepared by combining about 0.333 normal mole of a diglycidyl ether of bishphenol-A epoxy resin (E3002), 0.367 normal mole of cyclo-aliphatic epoxy resin CY179, and about 0.300 normal mole of triglycidyl isocyanurate resin (TIC) in a double planetary mixer (model DPM-4, Charles Ross & Son, Hauppauge, N.Y.). The first solution is mixed at about 150 rpm and at a temperature of about 100° C. for about 45 minutes. A second solution is prepared by melting about 0.825 normal moles of HHPA at about 45° C. and then adding the melt to the first solution. The second solution is stirred at about 300 rpm and at a temperature of about 100° C. for about 5 minutes.

A third solution is prepared by adding the filler particles to the second solution to constitute about 40% by weight of the encapsulant. The filler particles are maintained at 75° C. before this addition step. The third solution is stirred at about 300 rpm and at a temperature of about 100° C. for about 5 minutes. The fourth solution is prepared by combining about 0.0072 normal mole of TPPP, about 0.00553 normal mole of 2E4M and about 0.015 normal mole of HHPA at about 45° C. A fourth solution is mixed at about 100 rpm for at least 10 minutes. A fifth solution is prepared by addition of the fourth solution to the third solution. The fifth solution is mixed at about 300 rpm and at a temperature of about 100° C. for about 11 minutes.

The resulting hot viscous solution at about 100° C. is cast into a sample mold maintained at a temperature of about 75° C. The mold then is cooled to about 45° C., and the final solution is partially cured at this temperature for about 23 hours. The solid pellet thereby obtained has dimensions of about 13 mm diameter and about 14 mm length at a room temperature of about 20° C.

The solid pellet and an optoelectronic device are then placed in a transfer-molding machine (model number TTM-MS MS-011, Takara Tool & Die Company, Japan). The optoelectronic device is encapsulated within three minutes by heating the filled epoxy resin composition to about 150° C. and applying a pressure of about 120 kg/cm$^2$. After the molding, the transfer-molding machine and the optoelectronic device are visually inspected. There are no remnants of the filled epoxy resin composition between the plunger and the mold die. Also, the runner and cavity areas of the die are free of remnants of the filled epoxy resin composition. The hand inspection reveals that the partially cured, filled epoxy resin composition is sufficiently hard for handling. Further, the wires and other components of the device are undamaged.

Finally, the encapsulated device is heated at a temperature of about 150° C. for about 3 hours to cure the filled epoxy resin composition. Samples having a thickness of about 1 mm are cut from the encapsulant to measure its physical properties. The CTE of the encapsulant is measured using a dynamic mechanical analyzer, Model No. DMA 7e, and a 2 millimeter quartz penetration probe, both manufactured by Perkin Elmer Analytical Instruments of Shelton, Conn. The sample is heated from about 30° C. to about 190° C., at a heating rate of about 3° C./min. During the measurements, a static load of about 110 milliNewtons is applied to the probe. The slope of the linear line obtained by best fit to the temperature versus linear thermal expansion data at the temperature range of 40° C. to 80° C. yields the CTE value of the encapsulant.

The average CTE of the encapsulant sample prepared in this example is about 40.0 ppm/° C., with a CTE variation of less than about±1% over its entire volume. The Tg of the encapsulant sample is determined using same dynamic mechanical analyzer. During the measurements, a dynamic load of about 110 milliNewtons with an amplitude of about±100 milliNewtons and a frequency of about 1 Hz is used. The Tg of the encapsulant sample prepared in this example is about 150° C. The transmittance of the sample is measured at a room temperature of about 20° C. using a visible light spectrometer (Cary 500 Scan, marketed by Varian Inc. of Palo Alto, Calif.). The sample has a transmittance of about 20% when measured at a wavelength of about 650 nm.

The encapsulated device is also tested for its environmental durability. In a first test, ten encapsulated devices, prepared in the manner described in this example, is maintained at about 100° C. for about 3000 hours. In a second test, another 10 encapsulated devices, prepared in the same manner, is maintained at 80° C. and 85% relative humidity for about 3000 hours. In a third test, another ten encapsulated devices, likewise prepared in the same manner, is repeatedly heated to about 125° C. and then cooled to about−40° C. for 3000 cycles. In this third test, each cycle includes (1) heating the device to about 125° C. from about−40° C. within about 30 minutes, (2) holding at about 125° C. for about 15 minutes, (3) cooling from about 125° C. to about−40° C. within about 30 minutes, and (4) holding at about−40° C. for about 15 minutes. Before and after each environmental test, the performance of the encapsulated device is measured. It is found that above tests do not affect the performance of these devices.

The results of EXAMPLE 17 indicate that the pellets, prepared from a ternary epoxy composition of E3002, CY179, and TIC, are suitable for encapsulating of optoelectronic devices by transfer-molding. These results further indicate that the encapsulant, prepared in the manner described in this example, provides excellent environmental durability to the device.

EXAMPLES 18-24

Encapsulants Prepared from Ternary Epoxy Mixtures

Seven encapsulants are prepared and analyzed in the same manner as in EXAMPLE 17, except that the ternary epoxy composition is varied as shown in Table 5. After the molding of each composition, the transfer-molding machine and the optoelectronic device are visually inspected. There are no remnants of the filled epoxy resin composition between the plunger and the mold die. Also, the runner and cavity areas of the die are free of remnants of the filled epoxy resin composition. The hand inspection reveals that the partially-cured filled epoxy resin composition is sufficiently hard for handling. Furthermore, the wires and other components of the device are undamaged.

Taken together, the results for EXAMPLES 17-24 indicate that the encapsulants prepared from a ternary epoxy composition of E3002, CY179, and TIC are suitable for encapsulation of optoelectronic devices by transfer-molding and, further, the Tg and the transmittance of the encapsulant can be varied by varying the ternary epoxy composition.

EXAMPLE 25

Encapsulant Prepared by Using Binary Epoxy Mixture

An encapsulant is prepared and analyzed in the same manner as in EXAMPLE 17, except that no TIC is incorporated into the resin composition. After the molding, the transfer-molding machine and the optoelectronic device are visually inspected. Remnants of the filled epoxy resin composition are found between the plunger and the mold die. Also, the components of the device such as wires or chip condensers are damaged in more than 8% of the devices manufactured using the encapsulant prepared from binary epoxy composition.

The results for Example 25 indicate that pellets prepared from a binary epoxy mixture of E3002 and CY179 are not as suitable for encapsulation of optoelectronic devices by transfer-molding as those pellets prepared from ternary epoxy composition.

EXAMPLE 26

Encapsulant Prepared by Using Binary Epoxy Mixture

An encapsulant is prepared and analyzed in the same manner as in EXAMPLE 17, except that no CY 179 is incorporated into the resin composition. After the molding, the transfer-molding machine and the optoelectronic device are visually inspected. Remnants of the encapsulant are found in the runner and cavity areas of the die. When inspected by hand, the encapsulant is found to be too soft for handling.

The results for EXAMPLE 26 indicate that pellets prepared from binary epoxy composition of E3002 and TIC are not as suitable for encapsulation of optoelectronic devices by transfer-molding as those pellets prepared from ternary epoxy composition.

COMPARATIVE EXAMPLE 6

Encapsulant Incorporating No Filler Particles

An encapsulant is prepared and analyzed in the same manner as in EXAMPLE 17, except that no filler particles are incorporated into the resin composition. Properties of the encapsulant, and the epoxy resin composition prepared in this example are shown in Table 5. The transmittance of this encapsulant is about 93%. However, the average CTE is very high, about 65.0 ppm/° C.

TABLE 5

| | Encapsulant | | | | | Molar Ratios of Epoxy Resin Compositions | | | | | |
| | CTE | | | | | Ternary Epoxy Mixture | | | Hardener | Accelerator | |
| Examples | Average ppm/° C. | Variation ± % | Transmittance* % | Tg ° C. | Filler weight % | E3002 mole | CY179 mole | TIC mole | HHPA mole | TPPP mole | 2E4M mole |
|---|---|---|---|---|---|---|---|---|---|---|---|
| Example 17 | 40.0 | 1 | 20 | 150 | 40.0 | 0.333 | 0.367 | 0.300 | 0.825 | 0.0072 | 0.00553 |
| Example 18 | 40.0 | 1 | — | — | 40.0 | 0.350 | 0.100 | 0.550 | 0.825 | 0.0072 | 0.00553 |
| Example 19 | 40.0 | 1 | 45 | 150 | 40.0 | 0.258 | 0.258 | 0.483 | 0.825 | 0.0072 | 0.00553 |
| Example 20 | 40.0 | 1 | 75 | — | 40.0 | 0.050 | 0.317 | 0.633 | 0.825 | 0.0072 | 0.00553 |
| Example 21 | 40.0 | 1 | 70 | — | 40.0 | 0.154 | 0.354 | 0.492 | 0.825 | 0.0072 | 0.00553 |
| Example 22 | 40.0 | 1 | 80 | — | 40.0 | 0.050 | 0.450 | 0.500 | 0.825 | 0.0072 | 0.00553 |
| Example 23 | 40.0 | 1 | — | 155 | 40.0 | 0.300 | 0.540 | 0.160 | 0.825 | 0.0072 | 0.00553 |
| Example 24 | 40.0 | 1 | 75 | — | 40.0 | 0.164 | 0.418 | 0.418 | 0.825 | 0.0072 | 0.00553 |
| Example 25 | 40.0 | 1 | 85 | 169 | 40.0 | 0.164 | 0.836 | 0.000 | 0.825 | 0.0072 | 0.00000 |
| Example 26 | 40.0 | 1 | 30 | — | 40.0 | 0.415 | 0.000 | 0.585 | 0.825 | 0.0072 | 0.00553 |
| Comparative Example 6 | 65.0 | 1 | 93 | — | 0.00 | 0.183 | 0.450 | 0.367 | 0.825 | 0.0072 | 0.00553 |

*The transmittance is measured at 650 nm for 1 mm thick encapsulant.

Although the invention has been described in detail with reference only to the presently preferred encapsulants and methods of preparation, those of ordinary skill in the art will appreciate that various modifications can be made without departing from the invention. Accordingly, the invention is defined only by the following claims.

We claim:

1. An encapsulant for an optoelectronic device or optical component, the encapsulant characterized by a coefficient of thermal expansion and an optical transmittance, the encapsulant comprising:
    a filler consisting essentially of glass particles having diameters smaller than 250 μm, wherein the glass particles: are characterized by a glass refractive index having a value in the range of 1.48 to 1.60; consist essentially borosilicate; and comprise 10% to 50%, by volume, of the total volume of the encapsulant; and
    an epoxy resin composition at a cured stage, characterized by a refractive index of the epoxy resin composition at a cured stage;
    wherein the coefficient of thermal expansion of the encapsulant has an average value of less than 50 ppm/° C., with a variation of less than ±30%;
    wherein the glass refractive index and the refractive index of the epoxy resin composition at a cured stage have values sufficiently similar such that the optical transmittance of the encapsulant is at least 20% when measured at a wavelength in the range of 400 nm to 900 nm at an encapsulant thickness of about 1 mm; and
    wherein the encapsulant has been prepared by mixing an epoxy resin composition with the filler, wherein the viscosity of the epoxy resin composition prior to the mixing has a value in the range of 300 cP to 40,000 cP and wherein the epoxy resin composition comprises at least one hardener, at least one accelerator, and a ternary epoxy mixture consisting of a bisphenol-A epoxy resin, a cyclo-aliphatic epoxy resin, and triglycidyl isocyanurate resin.

2. An encapsulant as defined in claim 1, wherein the coefficient of thermal expansion of the encapsulant has a variation of less than±10%.

3. An encapsulant as defined in claim 1, wherein the coefficient of thermal expansion of the encapsulant has an average value of less than 40 ppm/° C.

4. An encapsulant as defined in claim 1, wherein the optical transmittance of the encapsulant is at least 40% when measured at a wavelength in the range of 400 nm to 900 nm at an encapsulant thickness of about 1 mm.

5. An encapsulant as defined in claim 1, wherein the optical transmittance of the encapsulant is at least 60% when measured at a wavelength in the range of 400 nm to 900 nm at an encapsulant thickness of about 1 mm.

6. An encapsulant as defined in claim 1, wherein the glass particles are essentially free of alkali.

7. An encapsulant as defined in claim 1, wherein the glass particles have diameters in the range of 1 μm to 250 μm.

8. An encapsulant as defined in claim 1, wherein the glass particles have diameters in the range of 1 μm to 125 μm.

9. An encapsulant as defined in claim 1, wherein less than 60%, by volume, of the filler comprises glass particles having diameters smaller than 10 μm.

10. An encapsulant as defined in claim 1, wherein less than 20%, by volume, of the filler comprises glass particles having diameters smaller than 10 μm.

11. An encapsulant as defined in claim 1, wherein less than 10%, by volume, of the filler comprises glass particles having diameters smaller than 10 μm.

12. An encapsulant as defined in claim 1, wherein the filler comprises 15 to 40%, by volume, of the total volume of encapsulant.

13. An encapsulant as defined in claim 1, wherein the filler further comprises glass particles that have been heat treated at a heat treatment temperature for at least about 1 hour, wherein the heat treatment temperature is less than or equal to the strain point of the glass particles.

14. An encapsulant as defined in claim 13, wherein the heat treatment temperature is between 20° C. and the strain point of the glass particles.

15. An encapsulant as defined in claim 13, wherein the glass particles have been heat treated at a heat treatment temperature for between 5 hours and 50 hours.

16. An encapsulant as defined in claim 13, wherein the glass particles have been heat treated at a heat treatment temperature for between 30 hours and 40 hours.

17. An encapsulant as defined in claim 1, wherein the filler further comprises glass particles that have been reacted with a silane coupling agent selected from the group consisting of aminopropyltriethoxysilane, vinyltrimethoxysilane, methacryloxy propyltriethoxysilane, 3-glycidoxypropyltrimethoxysilane, and mixtures thereof.

18. An encapsulant as defined in claim 17, wherein the silane coupling agent is selected from the group consisting of aminopropyltriethoxysilane, 3-glycidoxypropyltrimethoxysilane, and mixtures thereof.

19. An encapsulant as defined in claim 1, wherein the hardener is selected from the group consisting of acid anhydride hardeners, phenolic hardeners, and mixtures thereof.

20. An encapsulant as defined in claim 1, wherein the hardener is selected from the group consisting of phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride, and phenolic novolac resin hardeners, and mixtures thereof.

21. An encapsulant as defined in claim 1, wherein the hardener is selected from the group consisting of phthalic anhydride, hexahydroplithalic anhydride, tetrahydrophthalic anhydride, methylhexahydrophthalic anhydride, phenolic novolac resin hardeners, and mixtures thereof.

22. An encapsulant as defined in claim 1, wherein the hardener is hexahydrophthalic anhydride.

23. An encapsulant as defined in claim 1, wherein the accelerator is selected from the group consisting of 1,8-diazabicyclo[5,4,0]undecene-7, triethylenediamine, tertiary amines, 2-ethyl-4-methylimidazole, 2-methylimidazole, triphenylphosphite, tetraphenyiphosphonium tetraphenylborate, tetra-n-butylphosphonium O,O-diethyl phosphorodithioate, quaternary ammonium salts, organic metal salts, and mixtures thereof.

24. An encapsulant as defined in claim 1, wherein the accelerator is selected from the group consisting of triphenylphosphite, 2-ethyl-4-methylimidazole, and mixtures thereof.

25. An encapsulant as defined in claim 1, wherein the ratio by molar amount of bisphenol-A epoxy resin to combined molar amount of bisphenol-A epoxy resin, cyclo-aliphatic epoxy resin, and triglycidyl isocyanurate resin is in the range of 0.05 to 0.6.

26. An encapsulant as defined in claim 1, wherein the ratio by molar amount of bisphenol-A epoxy resin to combined molar amount of bisphenol-A epoxy resin, cyclo-aliphatic epoxy resin, and triglycidyl isocyanurate resin is in the range of 0.15 to 0.40.

27. An encapsulant as defined in claim 1, wherein the ratio by molar amount of cyclo-aliphatic epoxy resin to combined molar amount of bisphenol-A epoxy resin, cyclo-aliphatic epoxy resin, and triglycidyl isocyanurate resin is in the range of 0.05 to 0.70.

28. An encapsulant as defined in claim 1, wherein the ratio by molar amount of cyclo-aliphatic epoxy resin to combined molar amount of bisphenol-A epoxy resin, cyclo-aliphatic epoxy resin, and triglycidyl isocyanurate resin is in the range of 0.10 to 0.55.

29. An encapsulant as defined in claim 1, wherein the ratio by molar amount of triglycidyl isocyanurate resin to combined molar amount of bisphenol-A epoxy resins, cyclo-aliphatic epoxy resin, and triglycidyl isocyanurate resin is in the range of 0.05 to 0.70.

30. An encapsulant as defined in claim 1, wherein the ratio by molar amount of triglycidyl isocyanurate resin to combined molar amount of bisphenol-A epoxy resin, cyclo-aliphatic epoxy resin, and triglycidyl isocyanurate resin is in the range of 0.20 to 0.65.

31. An encapsulant as defined in claim 1, wherein the ratio by molar amount of the hardener to combined molar amount of bisphenol-A epoxy resin, cyclo-aliphatic epoxy resin, and triglycidyl isocyanurate resin is in the range of 0.50 to 1.20.

32. An encapsulant as defined in claim 1, wherein the ratio by molar amount of the hardener to combined molar amount of bisphenol-A epoxy resin, cyclo-aliphatic epoxy resin, and triglycidyl isocyanurate resin is in the range of 0.70 to 1.00.

33. An encapsulant as defined in claim 1, wherein the ratio by molar amount of the accelerator to combined molar amount of bisphenol-A epoxy resin, cyclo-aliphatic epoxy resin, and triglycidyl isocyanurate resin is in the range of 0.001 to 0.050.

34. An encapsulant as defined in claim 1, wherein the ratio by molar amount of the accelerator to combined molar amount of bisphenol-A epoxy resin, cyclo-aliphatic epoxy resin, and triglycidyl isocyanurate resin is in the range of 0.004 to 0.030.

35. An assembly comprising an optoelectronic device substantially encased in an encapsulant as defined in claim 1.

36. An encapsulant for an optoelectronic device or optical component, the encapsulant characterized by a coefficient of thermal expansion and an optical transmittance, the encapsulant comprising:

1) between 15 volume percent and 40 volume percent of a filler consisting essentially of glass particles formed from an alkali-free borosilicate glass that has been silylated with 3-glycidoxypropyltrimethoxysilane, the particles having diameters in the range of 1 μm to 250 μm, of which particles less than 10 percent by volume have diameters less than 10 μm, wherein the glass is characterized by a glass refractive index having a value of about 1.526 and a variance of less than about 0.001, and 2) between 60 volume percent and 85 volume percent of an epoxy resin composition at a cured stage, wherein the epoxy resin composition has been prepared from a composition comprising diglycidyl ether of bisphenol-A resin, cyclo-aliphatic epoxy resin, triglycidyl isocyanurate resin, a hardener, and an accelerator; wherein the ratio by molar amount of diglycidyl ether of bisphenol-A resin to combined molar amount of diglycidyl ether of bisphenol-A resin, cyclo-aliphatic epoxy resin, and triglycidyl isocyanurate resin has a value in the range of 0.15 to 0.40; the ratio by molar amount of cyclo-aliphatic epoxy resin to combined molar amount of diglycidyl ether of bisphenol-A epoxy resin, the cyclo-aliphatic epoxy resin, and triglycidyl isocyanurate resin is 0.10 to 0.55; the ratio by molar amount of triglycidyl isocyanurate resin to combined molar amount of diglycidyl ether of bisphenol-A epoxy resin, the cyclo-aliphatic epoxy resin, and triglycidyl isocyanurate resin is 0.20 to 0.65; the ratio by molar amount of the hardener to combined molar amount of diglycidyl ether of bisphenol-A epoxy resin, the cyclo-aliphatic epoxy resin, and triglycidyl isocyanurate resin is 0.70 to 1.00; the ratio by molar amount of the accelerator to combined molar amount of diglycidyl ether of bisphenol-A epoxy resin, the cyclo-aliphatic epoxy resin, and triglycidyl isocyanurate resin is 0.004 to 0.030;

wherein the coefficient of thermal expansion of the encapsulant has an average value of less than about 40 ppm/° C. and a variation of less than about±10%, and the optical transmittance of the encapsulant is at least 20% when measured at a wavelength range of 400 nm to 900 nm at an encapsulant thickness of 1 mm, wherein the filler is dispersed within the epoxy resin composition, and wherein the viscosity of the epoxy resin composition prior to dispersion of the filler within the epoxy resin composition has a value in the range of 300 cP to 40,000 cP.

\* \* \* \* \*